(12) United States Patent
Matsunaga

(10) Patent No.: US 12,034,184 B2
(45) Date of Patent: Jul. 9, 2024

(54) BUSBAR MODULE

(71) Applicant: Yazaki Corporation, Tokyo (JP)

(72) Inventor: Yuta Matsunaga, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 249 days.

(21) Appl. No.: 17/739,234

(22) Filed: May 9, 2022

(65) Prior Publication Data

US 2022/0359957 A1    Nov. 10, 2022

(30) Foreign Application Priority Data

May 10, 2021    (JP) .................................. 2021-079410

(51) Int. Cl.
*H01R 25/16*       (2006.01)
*H01M 10/48*       (2006.01)
*H01M 50/507*      (2021.01)
*H01M 50/519*      (2021.01)
*H01M 50/522*      (2021.01)
*H01M 50/526*      (2021.01)
*H01M 50/583*      (2021.01)

(52) U.S. Cl.
CPC ....... *H01M 50/507* (2021.01); *H01M 10/486* (2013.01); *H01M 50/519* (2021.01); *H01M 50/522* (2021.01); *H01M 50/526* (2021.01); *H01M 50/583* (2021.01); *H01M 2200/103* (2013.01)

(58) Field of Classification Search
CPC .. H01R 25/16; H01M 50/507; H01M 50/519; H01M 50/522; H01M 50/526; H01M 50/583
See application file for complete search history.

(56) References Cited

U.S. PATENT DOCUMENTS

2018/0219204 A1    8/2018    Takase et al.
2020/0020916 A1    1/2020    Takamatsu et al.

FOREIGN PATENT DOCUMENTS

| | | |
|---|---|---|
| CN | 110707275 A | 1/2020 |
| JP | 2014-186864 A | 10/2014 |
| JP | 2017-027831 A | 2/2017 |
| JP | 2020-014369 A | 1/2020 |

*Primary Examiner* — Tremesha S Willis
(74) *Attorney, Agent, or Firm* — Sughrue Mion, PLLC

(57) ABSTRACT

A busbar module includes: busbars that are fixed to battery cells of a battery module; a plate-like flexible circuit body that includes conductors corresponding to the busbars; and a case that accommodates the circuit body and the busbars, in which the circuit body includes a trunk portion and a branch portion connected to the busbar, the branch portion includes a base layer, a metal foil that is the connection conductor, and a coating layer that covers the base layer and the metal foil, the branch portion has a facing portion facing a first surface of the busbar, the metal foil is connected to a connection target at a portion that is more adjacent to a distal end than the facing portion is, and the first surface has a groove-shaped recess provided at a portion facing the metal foil.

3 Claims, 20 Drawing Sheets

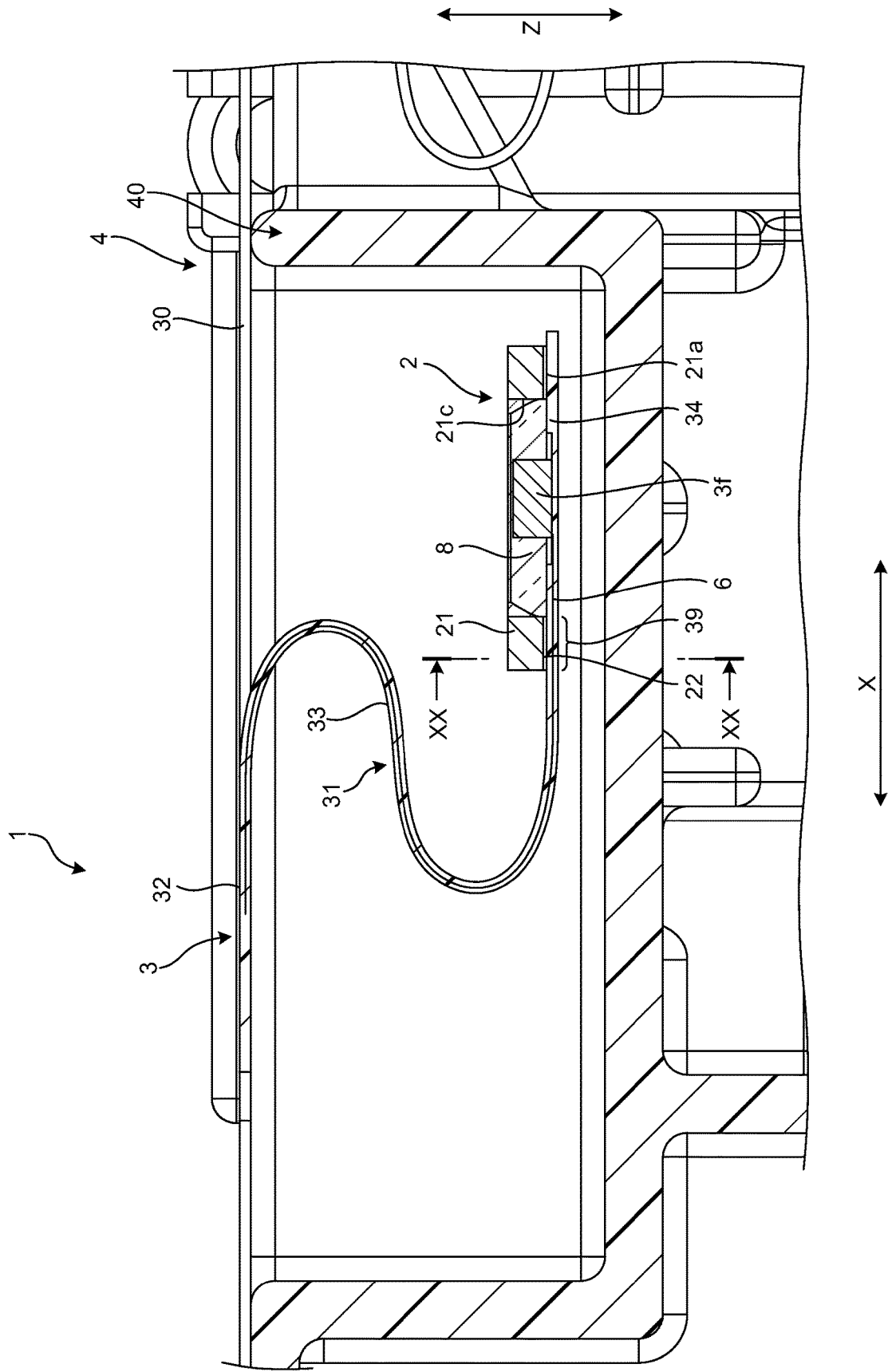

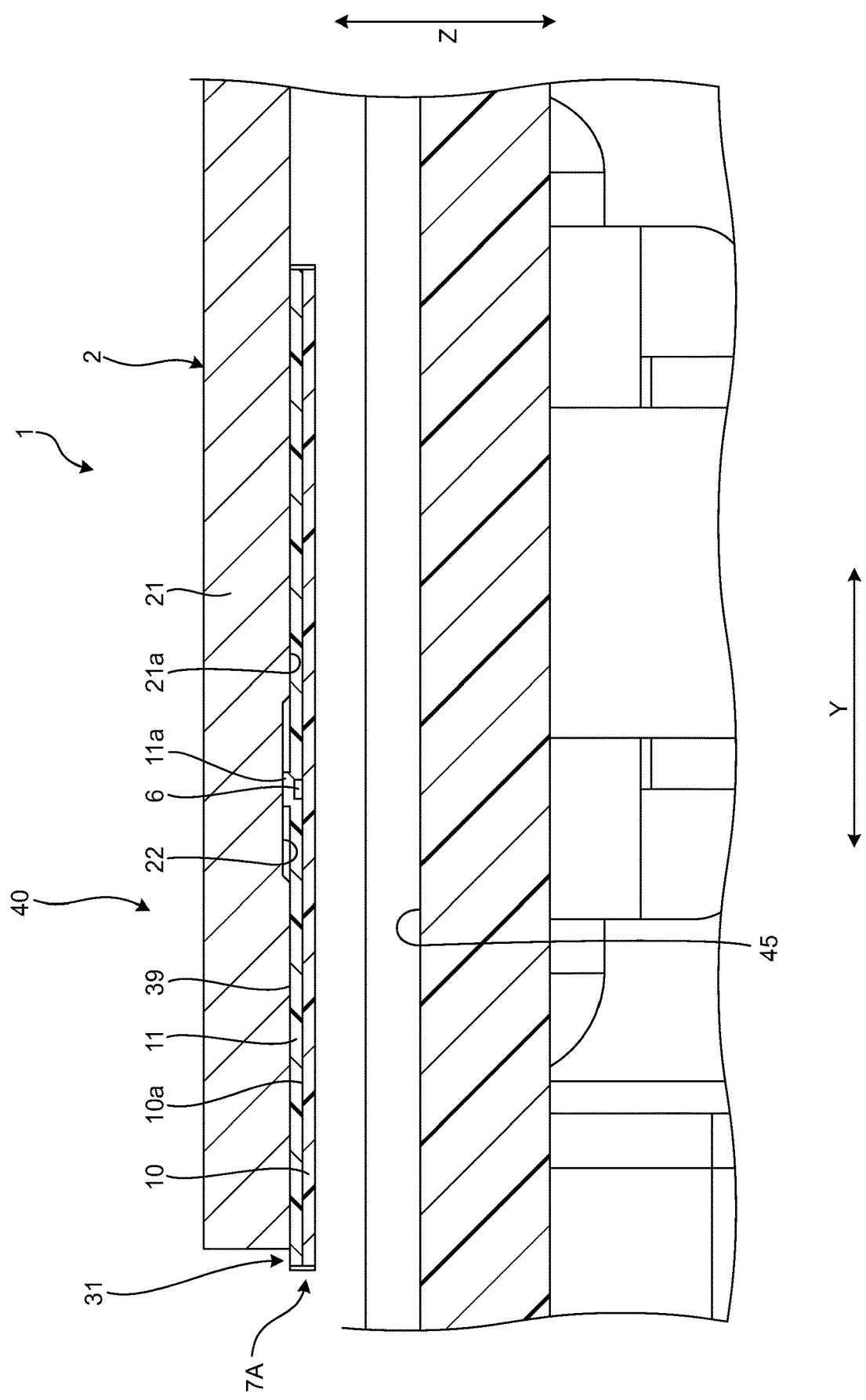

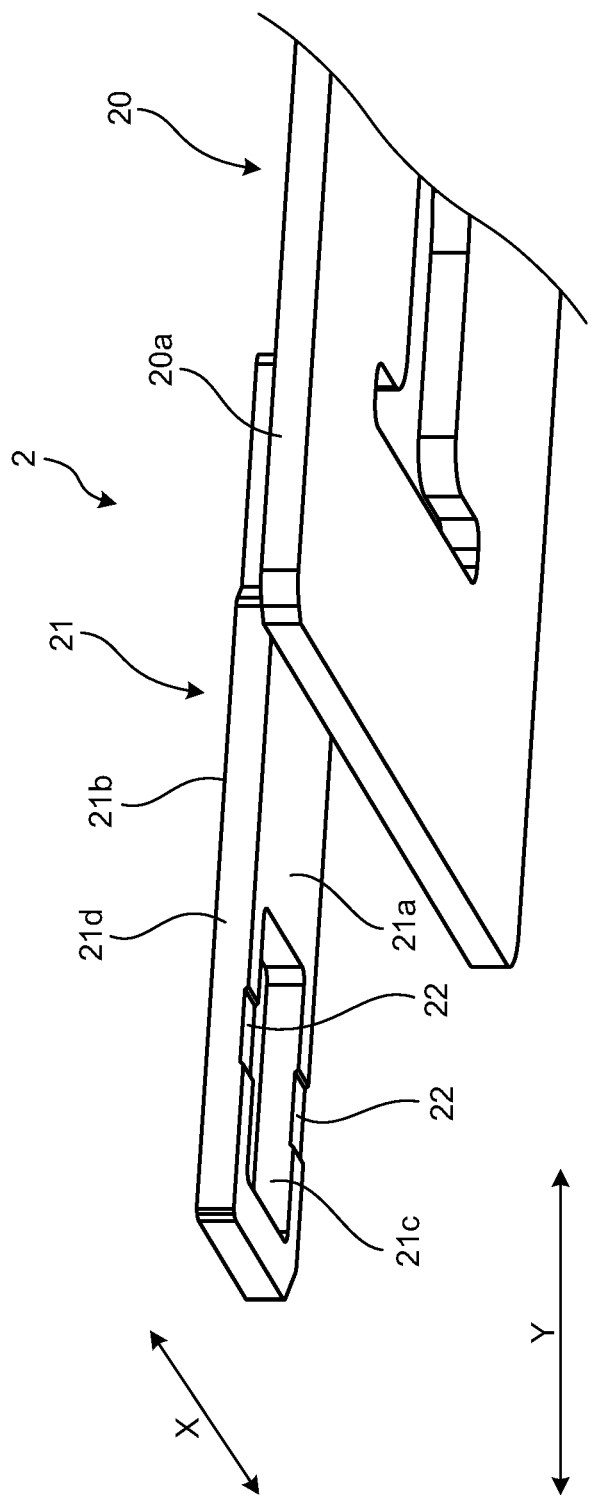

BUSBAR MODULE

CROSS-REFERENCE TO RELATED APPLICATION(S)

The present application claims priority to and incorporates by reference the entire contents of Japanese Patent Application No. 2021-079410 filed in Japan on May 10, 2021.

BACKGROUND OF THE INVENTION

1. Field of the Invention

The present invention relates to a busbar module.

2. Description of the Related Art

Conventionally, there is a module including a busbar and a circuit body. Japanese Patent Application Laid-open No. 2017-27831 discloses a battery wiring module including a plurality of connection members that connect electrode terminals of positive electrodes and negative electrodes of single batteries, and a flexible printed circuit board including a plurality of voltage detection lines that detect voltages of a plurality of single batteries via the plurality of connection members.

In the busbar module, it is desired that the connection conductor can be appropriately protected. For example, in a case where the connection conductor is a metal foil, it is desirable that damage to the metal foil can be suppressed at a portion where the busbar and the metal foil are close to each other.

SUMMARY OF THE INVENTION

An object of the present invention is to provide a busbar module capable of protecting a connection conductor.

In order to achieve the above mentioned object, a busbar module according to one aspect of the present invention includes a plurality of busbars configured to be fixed to a plurality of battery cells of a battery module including the plurality of battery cells; a plate-like flexible circuit body that includes a plurality of connection conductors corresponding to the plurality of busbars; and a case that accommodates the circuit body and the busbars, wherein the circuit body includes a trunk portion and a branch portion branching from the trunk portion and configured to be connected to the busbar, the branch portion includes a base layer, a metal foil that is the connection conductor and is formed on the base layer, and a coating layer that covers the base layer and the metal foil, the branch portion has a facing portion at which the coating layer faces a first surface of the busbar, the metal foil is connected to a connection target at a portion that is more adjacent to a distal end of the branch portion than the facing portion is, and the first surface of the busbar has a groove-shaped recess provided at a portion facing the metal foil.

According to another aspect of the present invention, in the busbar module, it is preferable that the connection target is a chip fuse interposed between the metal foil and the busbar, or a thermistor that detects a temperature of the battery cell.

According to still another aspect of the present invention, in the busbar module, it is preferable that the connection target is a chip fuse mounted on the branch portion and interposed between the metal foil and the busbar, the busbar has a through-hole opened in the first surface and overlaps the branch portion so as to expose the chip fuse in the through-hole, and the through-hole is filled with a potting agent.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 19 is a cross-sectional view of the circuit body and the busbar according to the embodiment;

FIG. 20 is a cross-sectional view of the circuit body and the busbar according to the embodiment; and FIG. 21 is a perspective view of the busbar according to the embodiment.

DETAILED DESCRIPTION OF THE PREFERRED EMBODIMENTS

Hereinafter, a busbar module according to an embodiment of the present invention will be described in detail with reference to the drawings. Note that the present invention is not limited by the embodiment. In addition, constituent elements in the following embodiment include those that can be easily assumed by those skilled in the art or those that are substantially the same.

Embodiment

Figure 1:
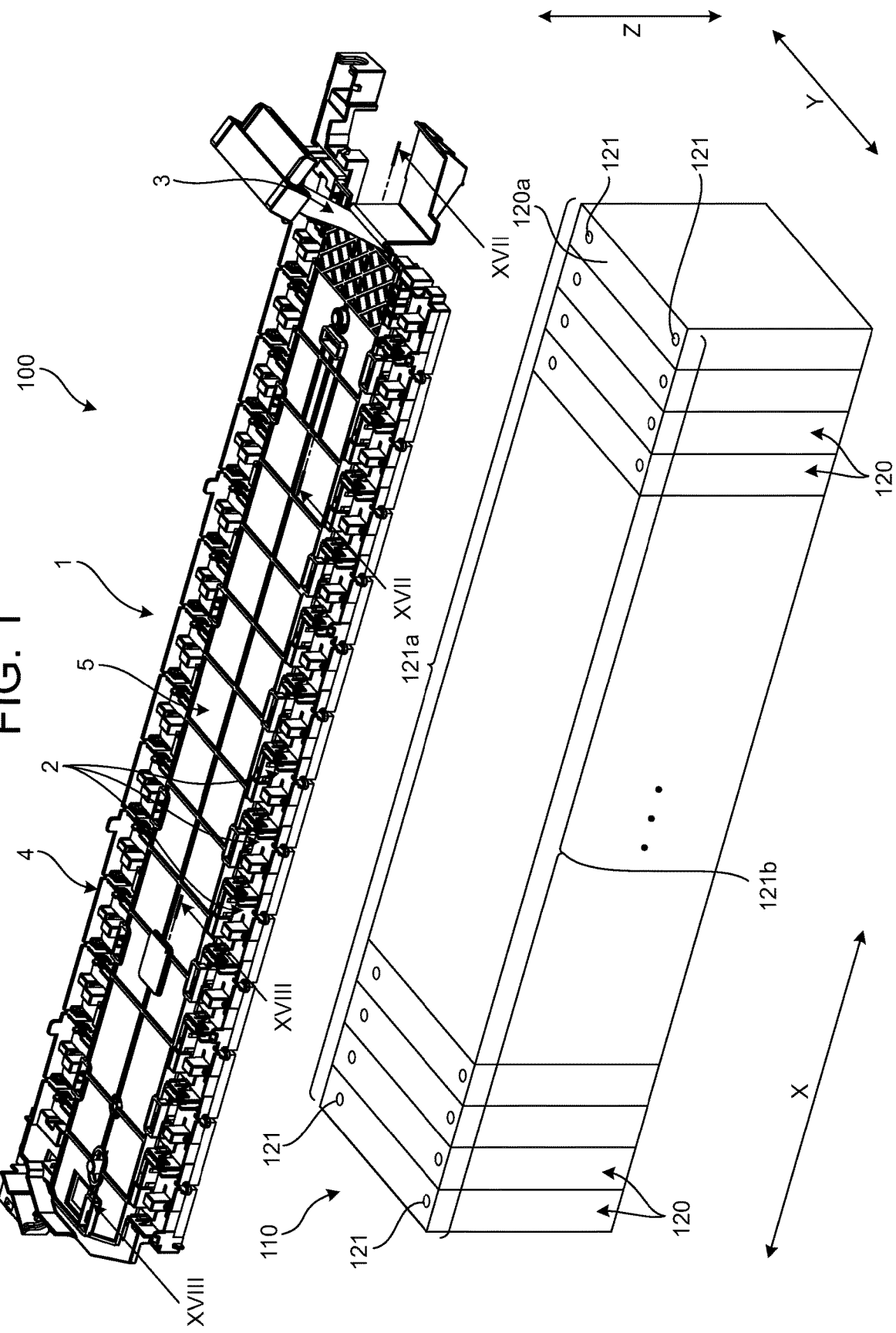
FIG. 1 is a perspective view of a busbar module and a battery module according to an embodiment.
Figure 2:
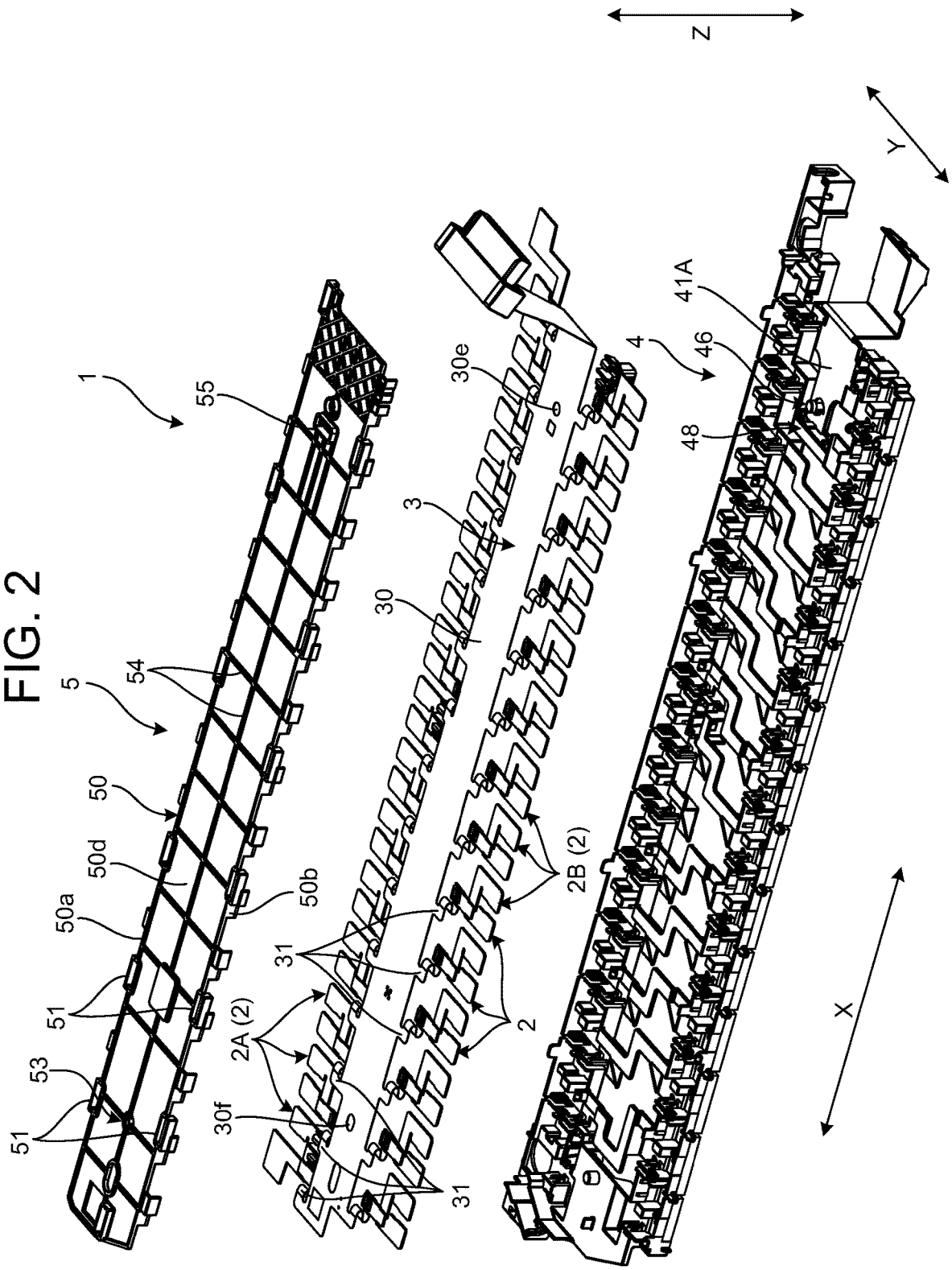
FIG. 2 is an exploded perspective view of the busbar module according to the embodiment.
Figure 3:
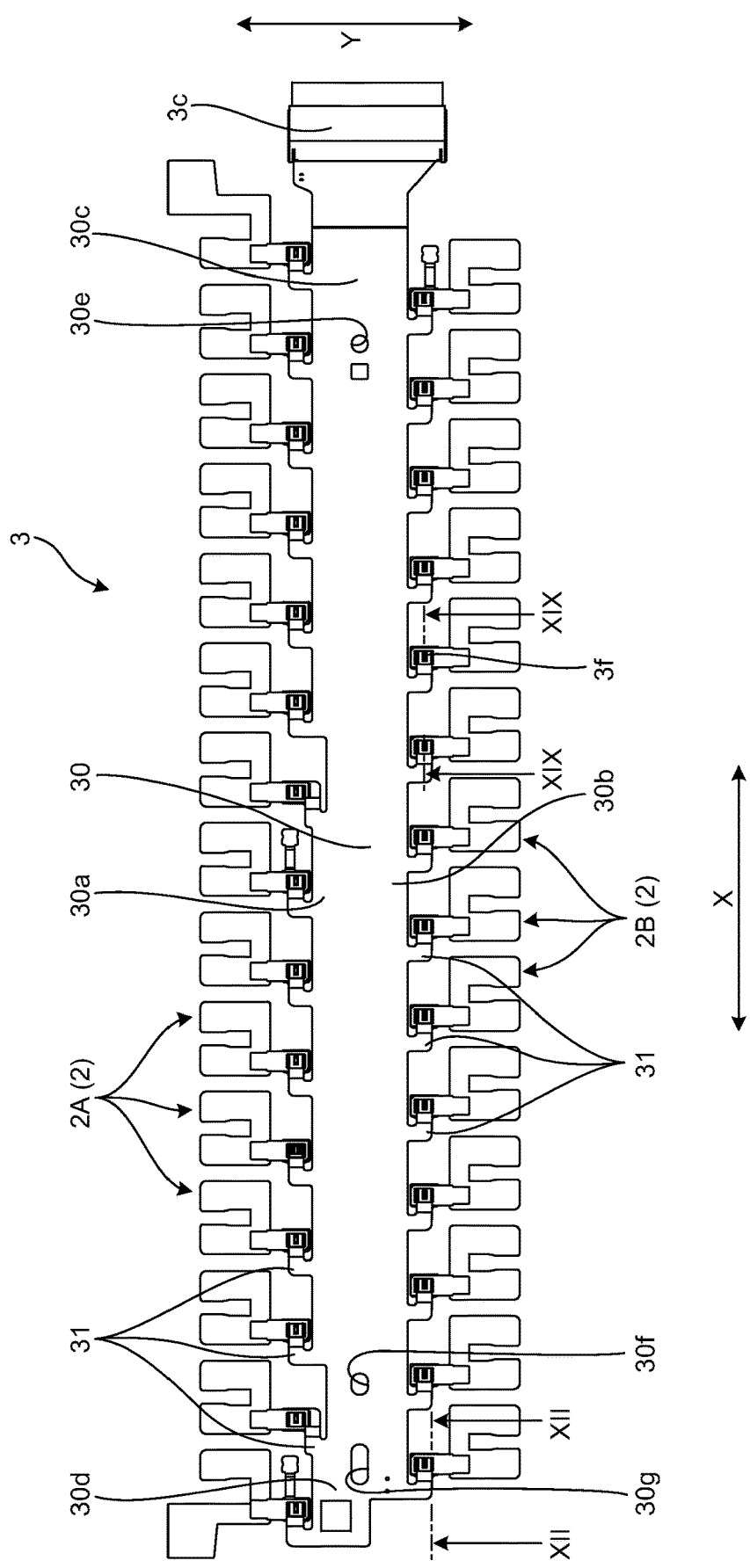
FIG. 3 is a plan view of a circuit body and a busbar according to the embodiment.
Figure 4:
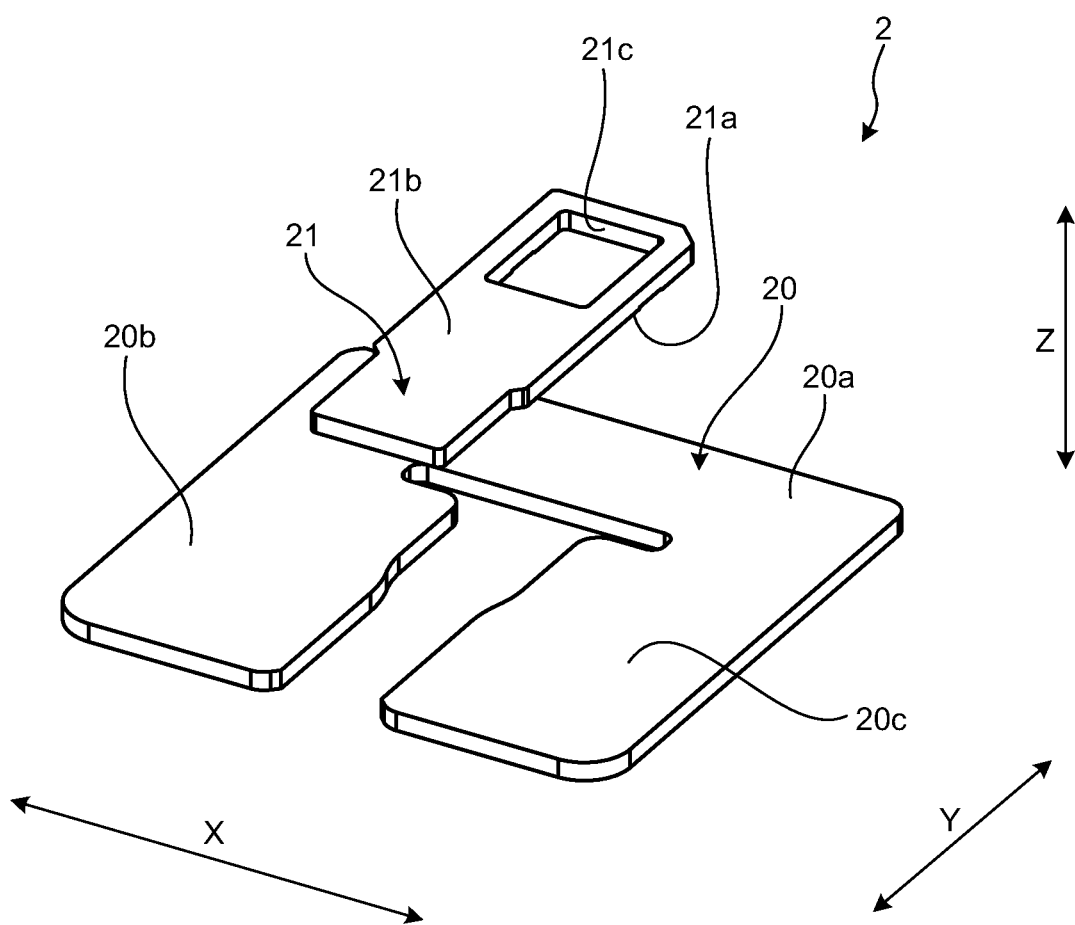
FIG. 4 is a perspective view of the busbar according to the embodiment.
Figure 5:
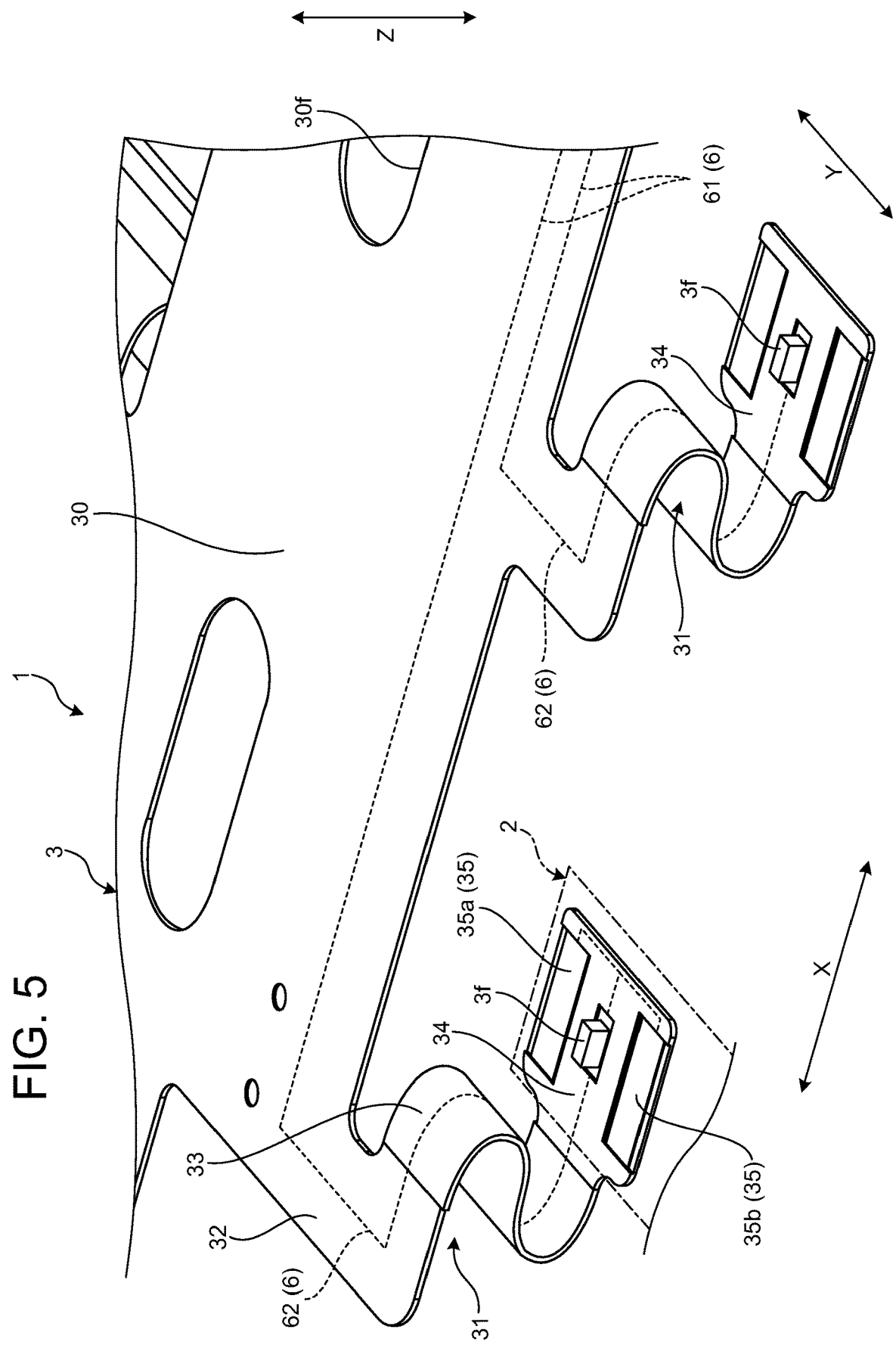
FIG. 5 is a perspective view illustrating a main part of the circuit body according to the embodiment.
Figure 6:
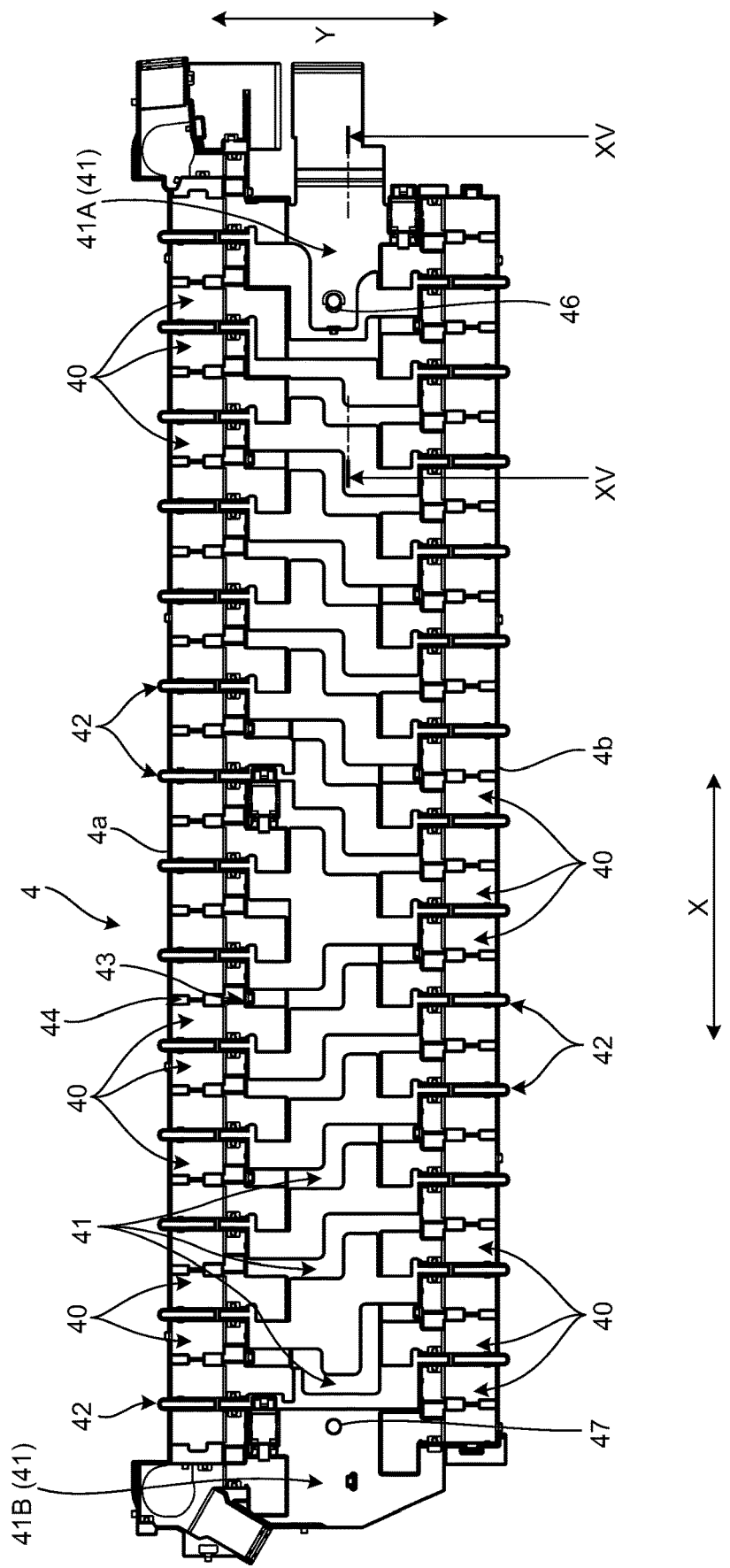
FIG. 6 is a plan view of a case according to the embodiment.
Figure 7:
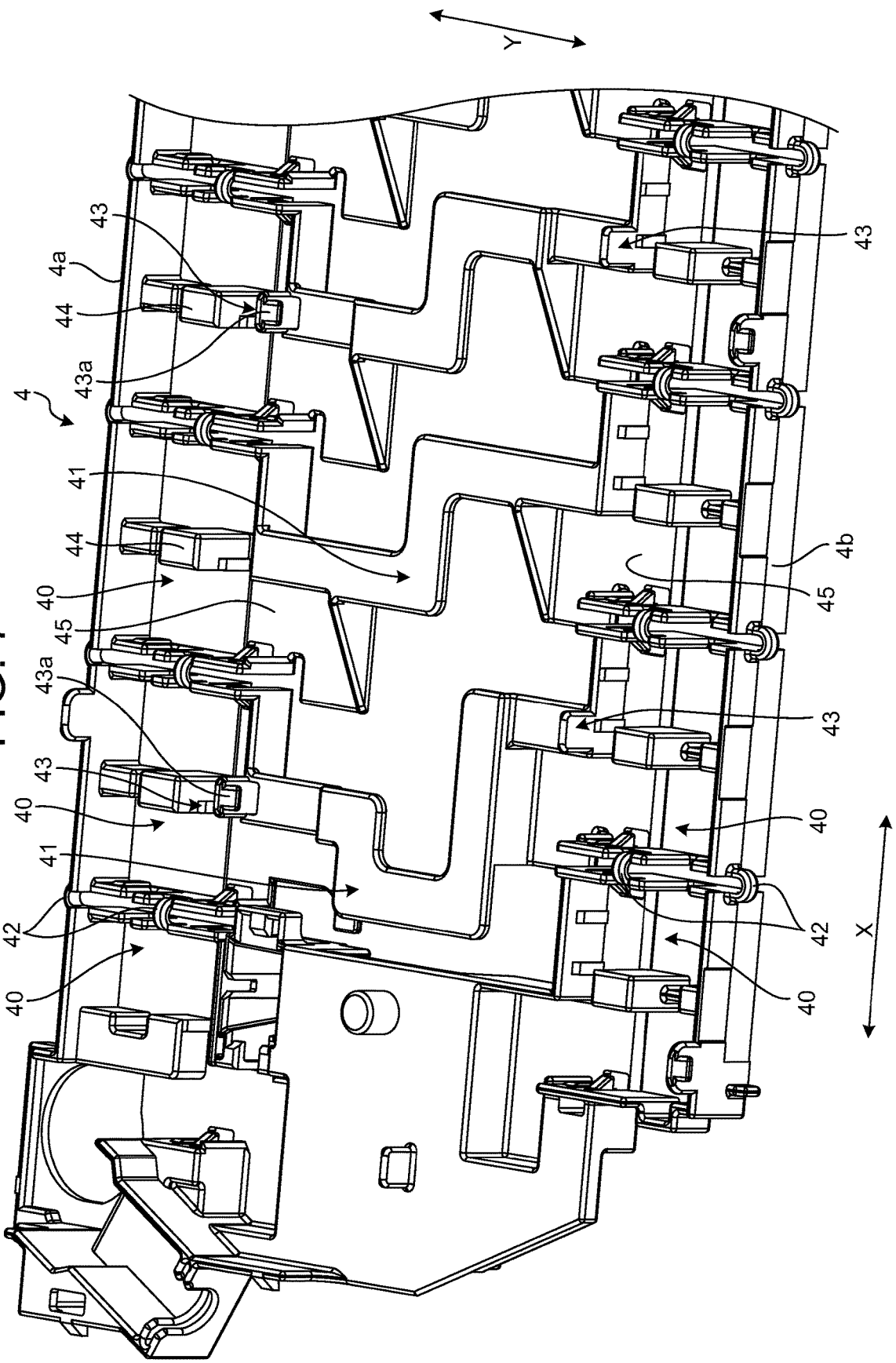
FIG. 7 is a perspective view of the case according to the embodiment.
Figure 8:
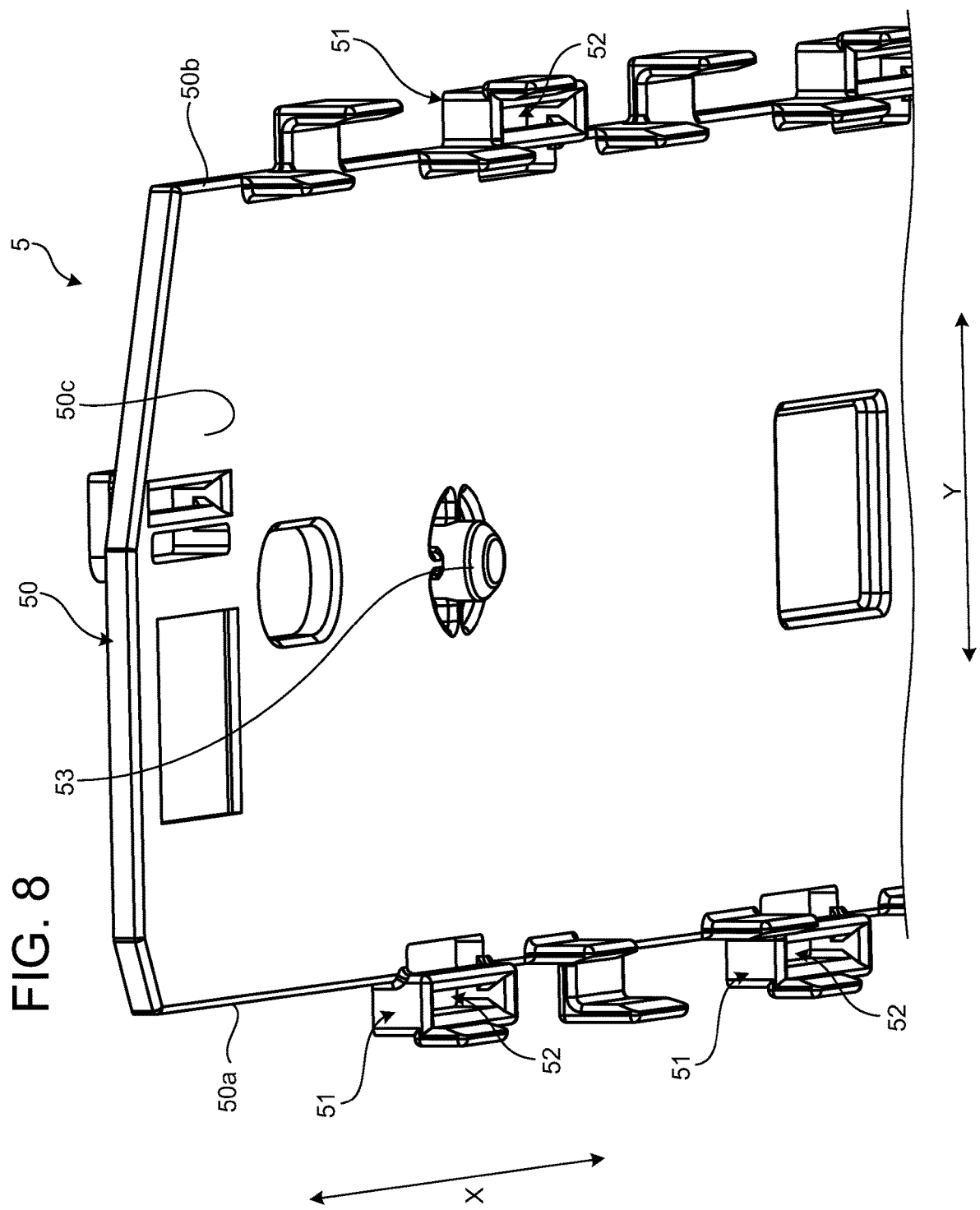
FIG. 8 is a perspective view of a cover according to the embodiment.
Figure 9:
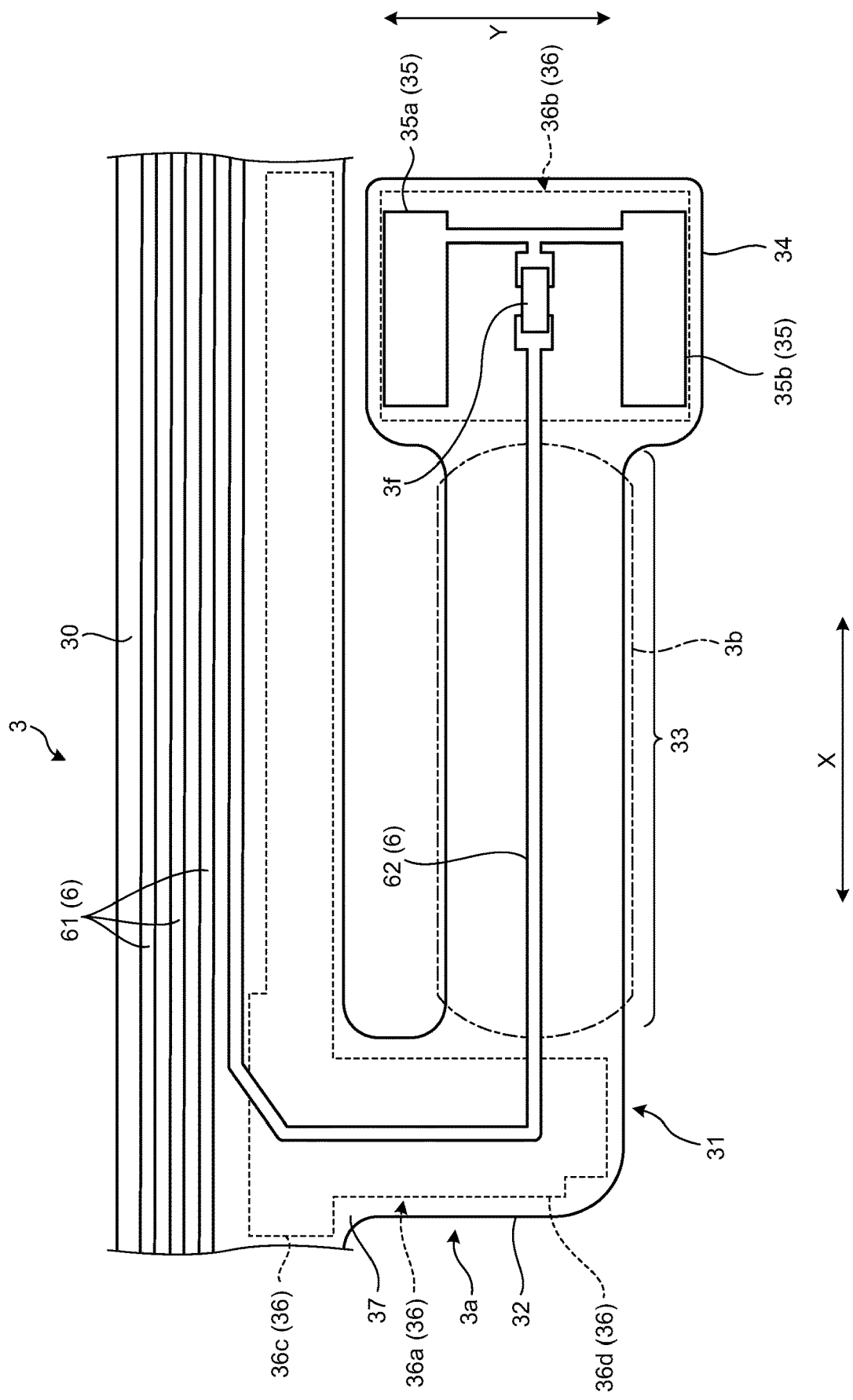
FIG. 9 is a view for describing an internal configuration of the circuit body according to the embodiment.

An embodiment will be described with reference to FIGS. 1 to 21. The present embodiment relates to a busbar module. FIG. 1 is a perspective view of a busbar module and a battery module according to the embodiment, FIG. 2 is an exploded perspective view of the busbar module according to the embodiment, FIG. 3 is a plan view of a circuit body and a busbar according to the embodiment, FIG. 4 is a perspective view of the busbar according to the embodiment, FIG. 5 is a perspective view illustrating a main part of the circuit body according to the embodiment, FIG. 6 is a plan view of a case according to the embodiment, FIG. 7 is a perspective view of the case according to the embodiment, FIG. 8 is a perspective view of a cover according to the embodiment, and FIG. 9 is a view for describing an internal configuration of the circuit body according to the embodiment.

Figure 10:
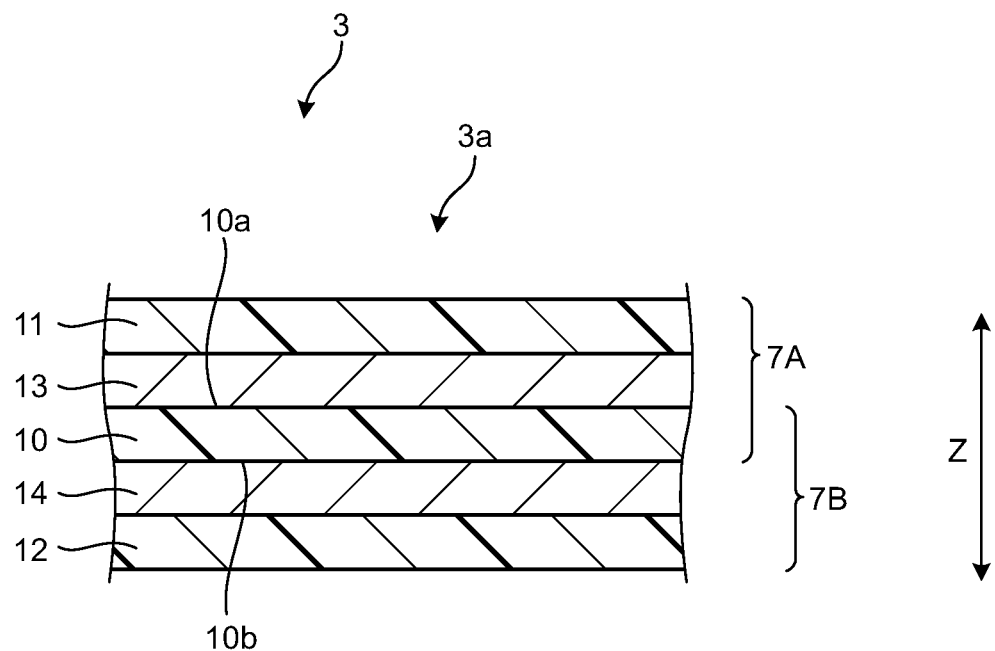
FIG. 10 is a cross-sectional view of a thick portion of the circuit body according to the embodiment.
Figure 11:
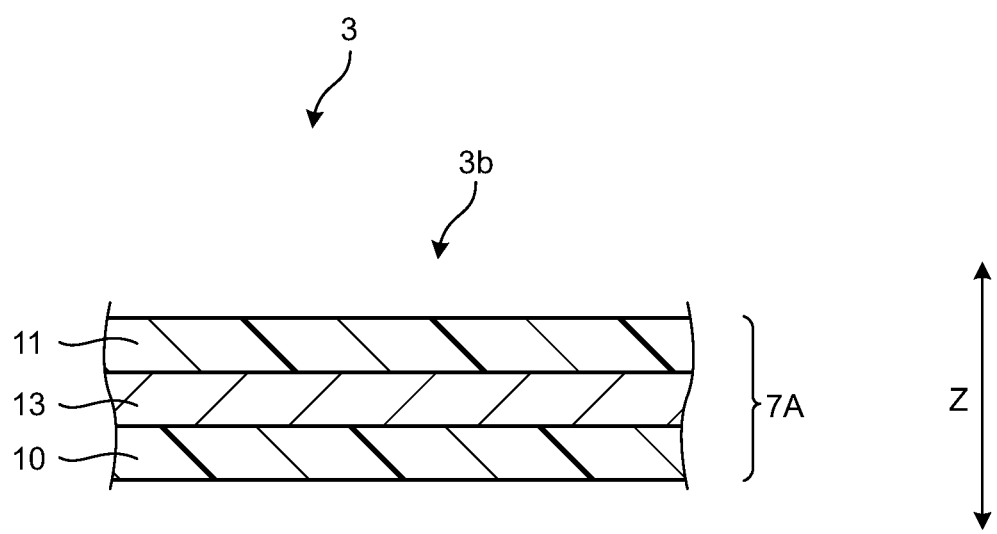
FIG. 11 is a cross-sectional view of a thin portion of the circuit body according to the embodiment.
Figure 12:
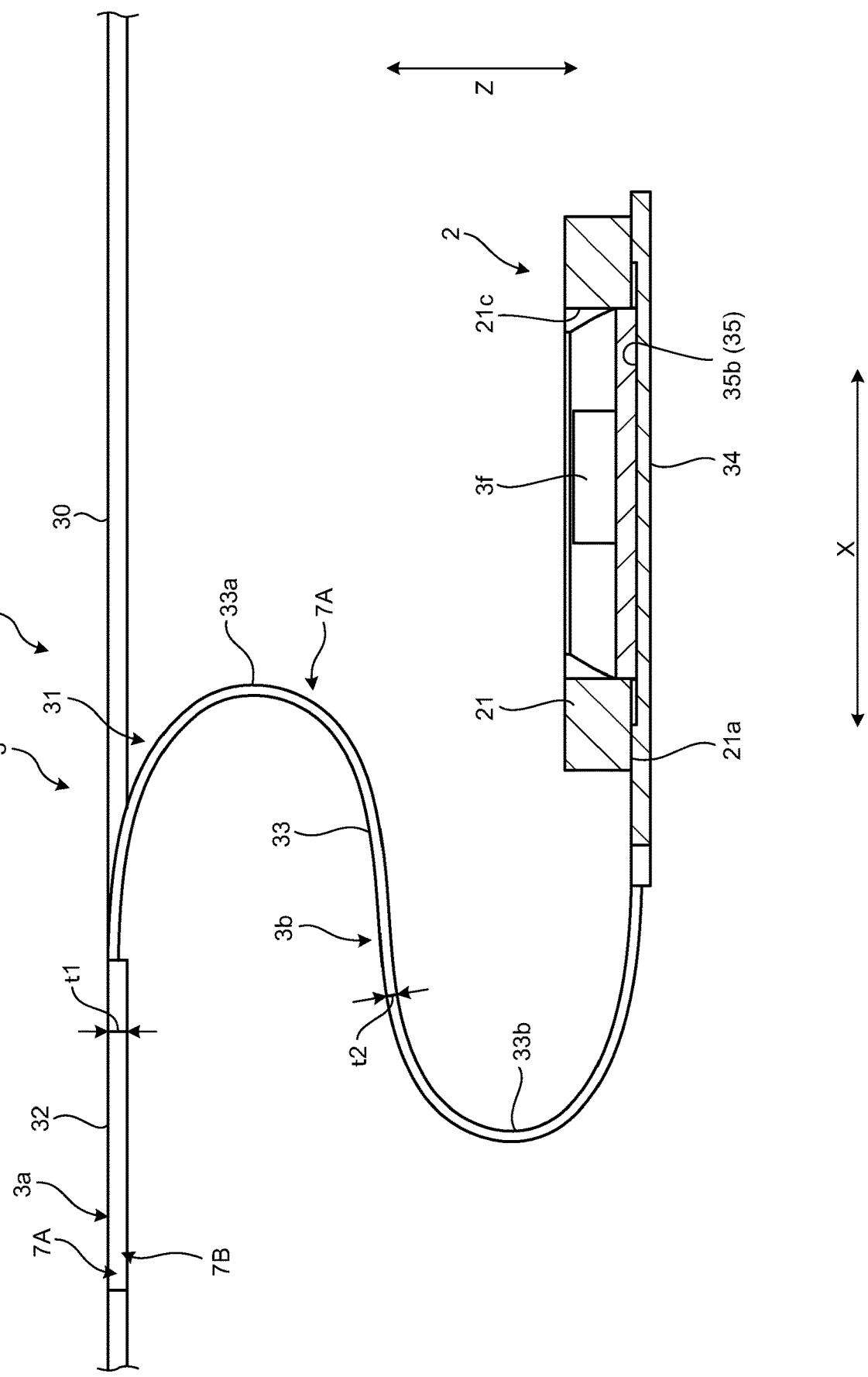
FIG. 12 is a cross-sectional view of the circuit body according to the embodiment.
Figure 13:
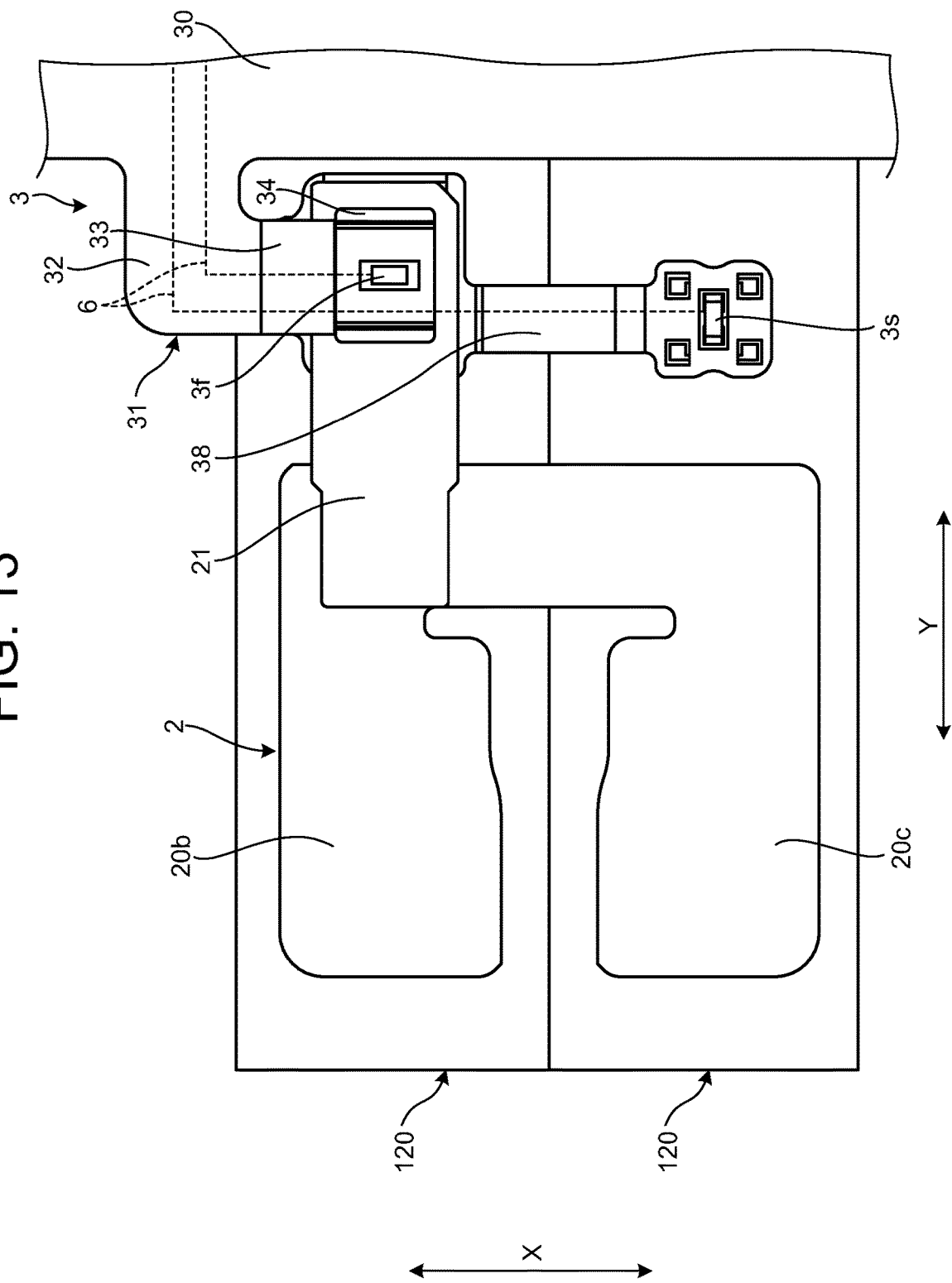
FIG. 13 is a perspective view of the circuit body according to the embodiment.
Figure 14:
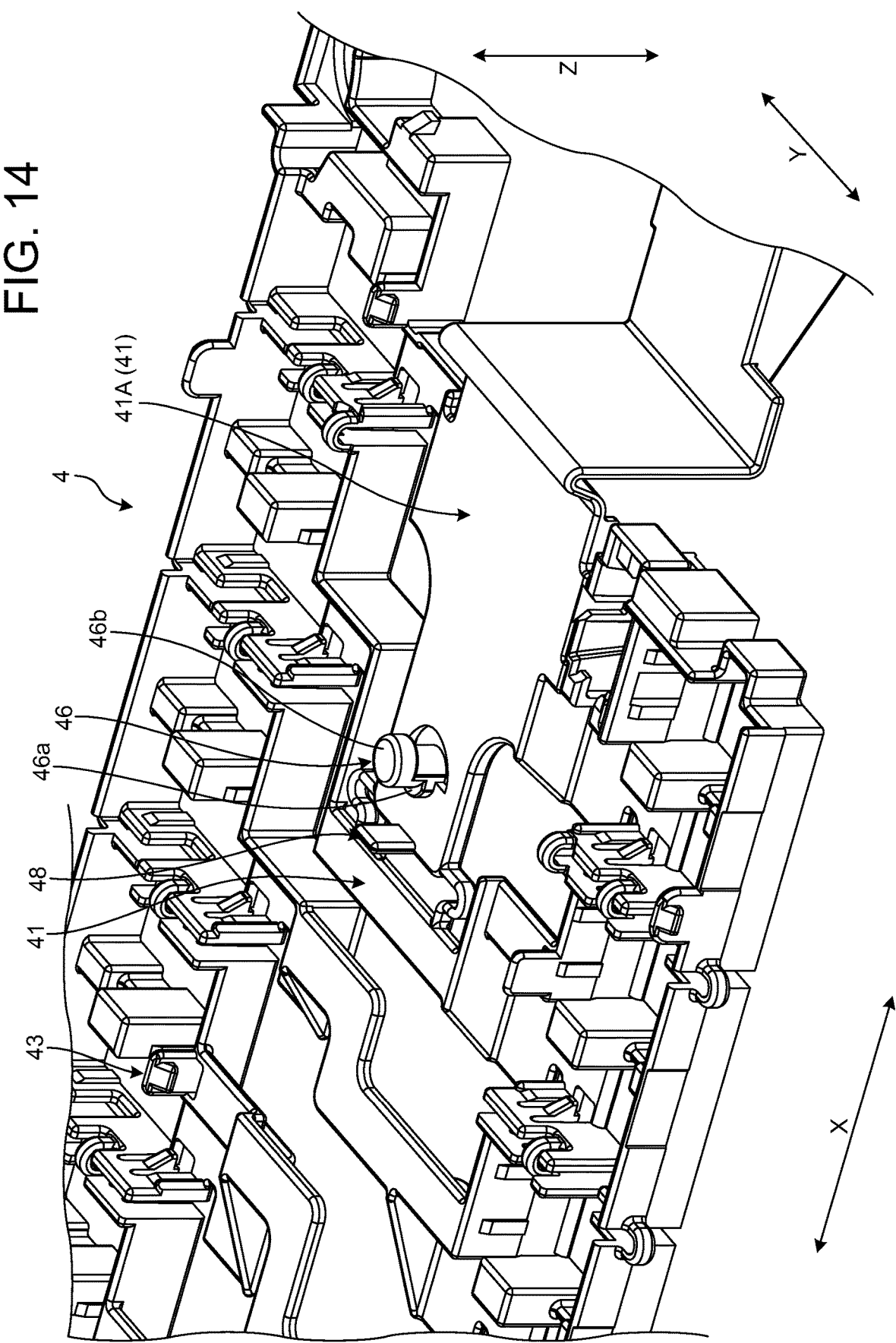
FIG. 14 is a perspective view of the case according to the embodiment.
Figure 15:
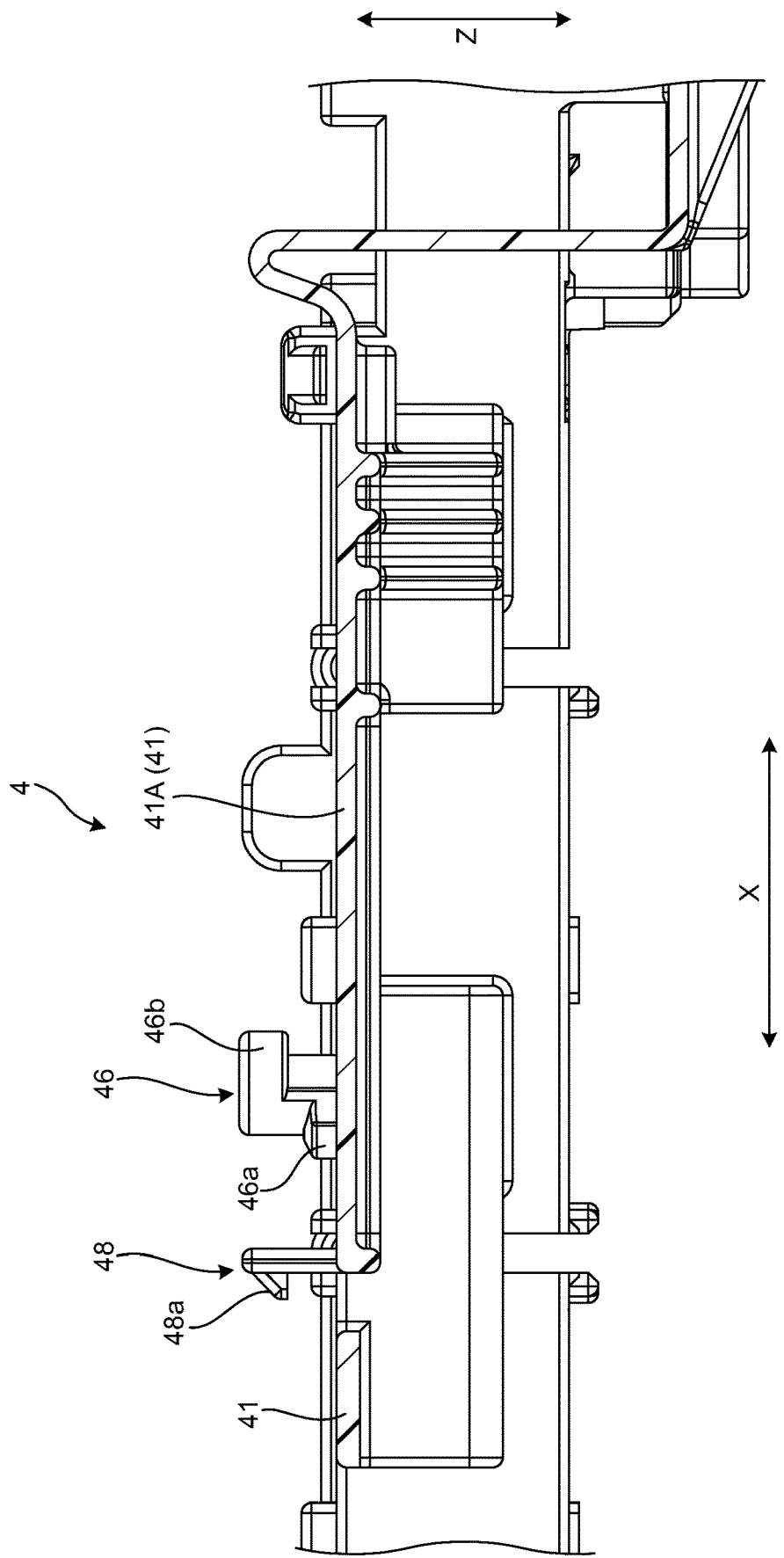
FIG. 15 is a cross-sectional view of the case according to the embodiment.
Figure 16:
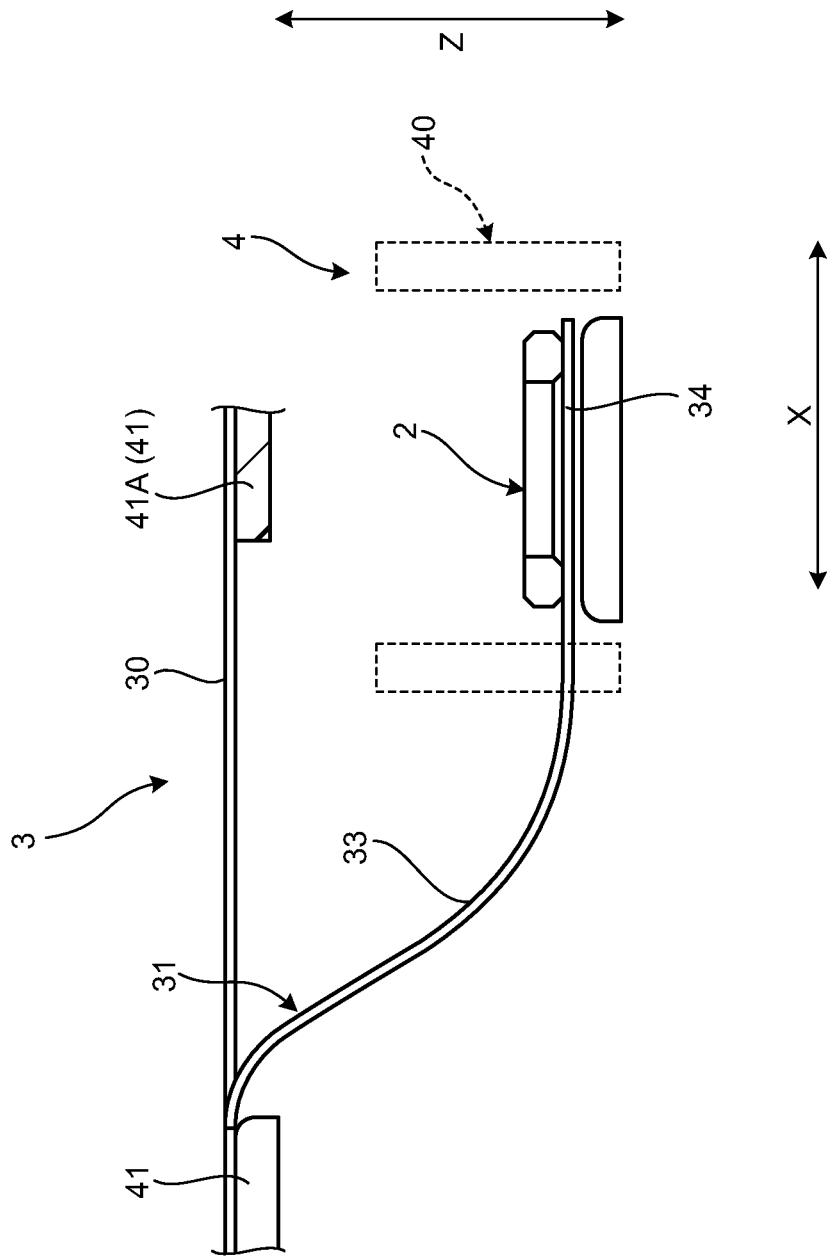
FIG. 16 is a side view of the case and the circuit body according to the embodiment.
Figure 17:
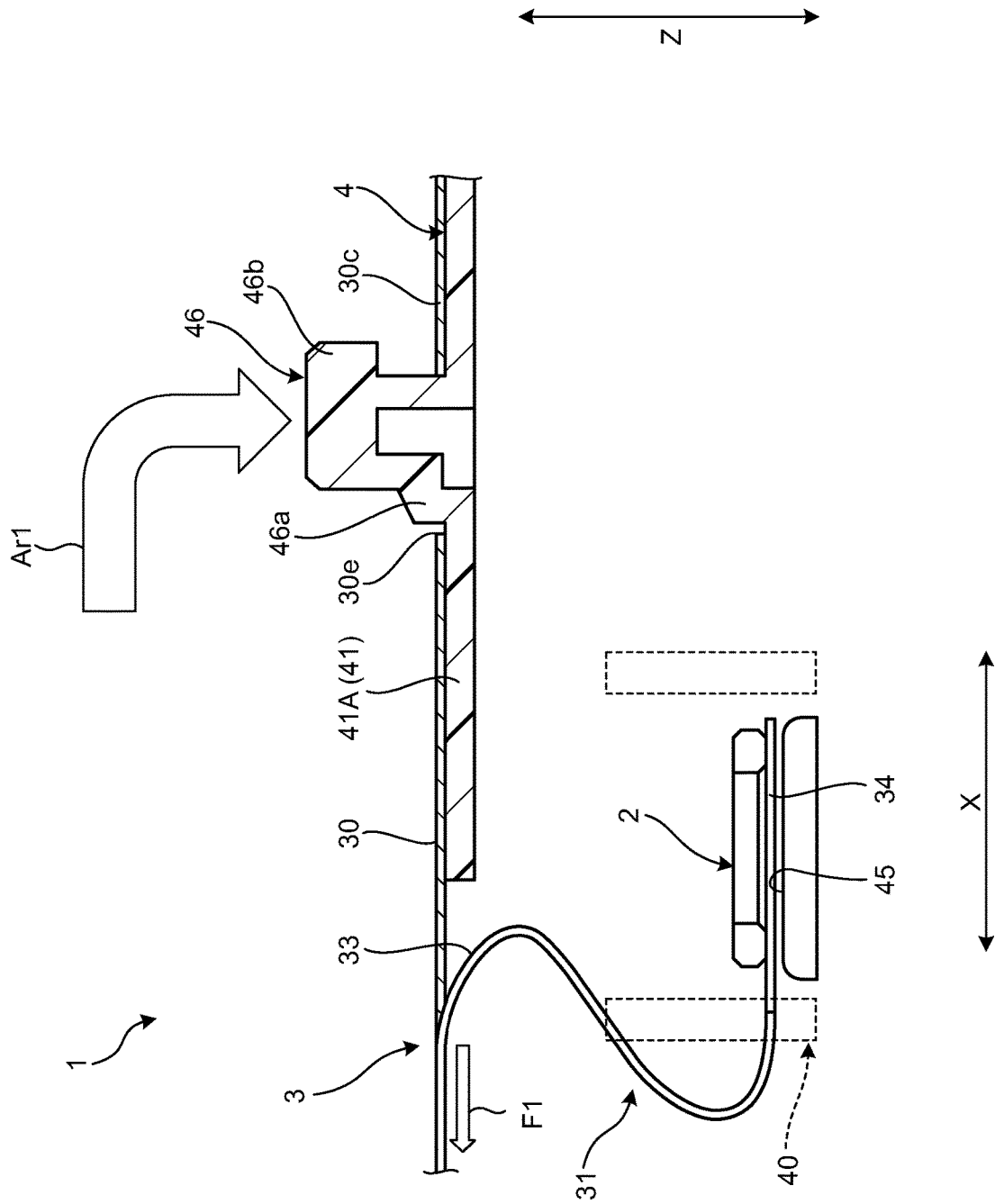
FIG. 17 is a cross-sectional view of the case and the circuit body according to the embodiment.
Figure 18:
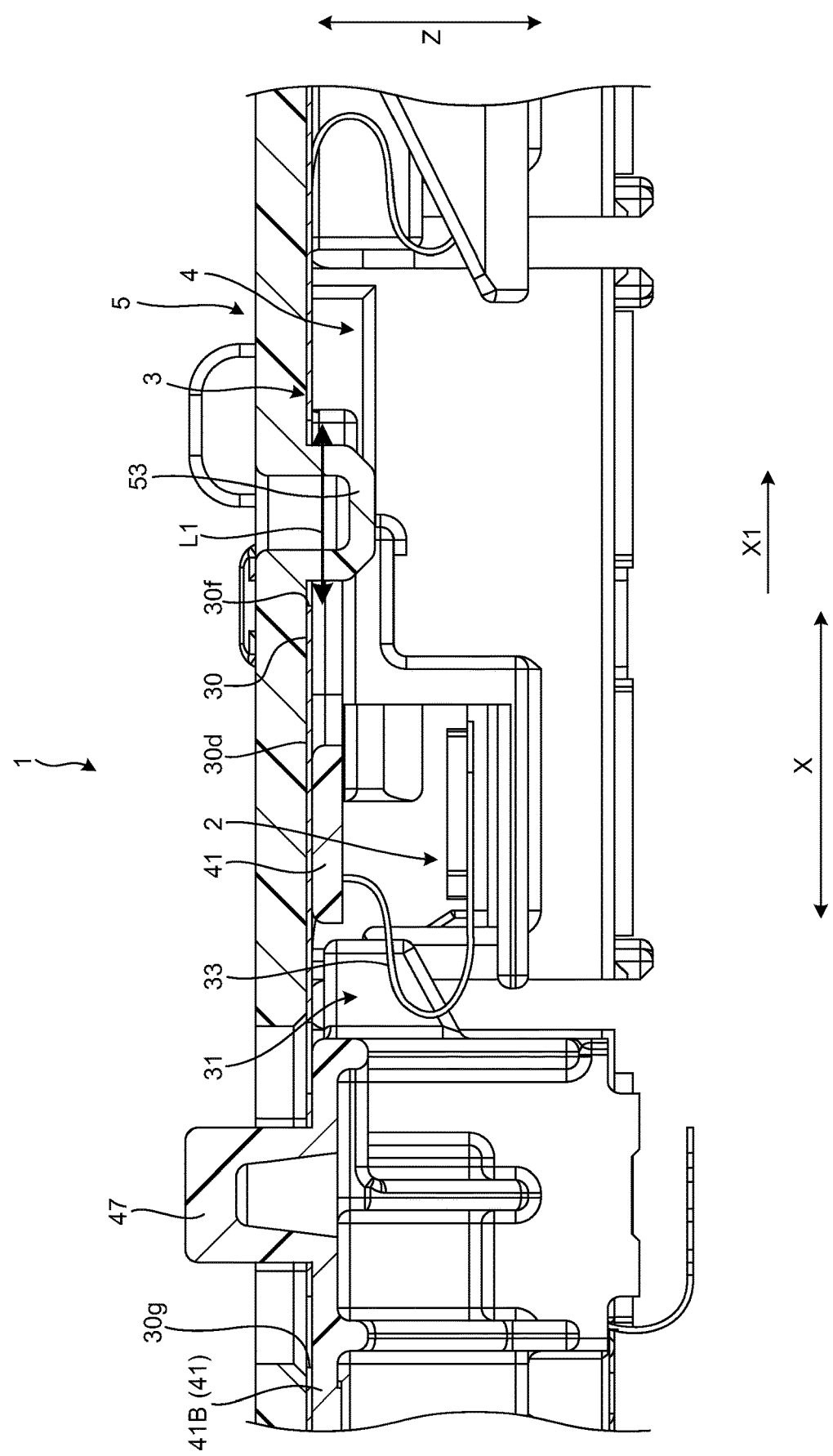
FIG. 18 is a cross-sectional view of the busbar module according to the embodiment.

FIG. 10 is a cross-sectional view of a thick portion of the circuit body according to the embodiment, FIG. 11 is a cross-sectional view of a thin portion of the circuit body according to the embodiment, FIG. 12 is a cross-sectional view of the circuit body according to the embodiment, FIG. 13 is a perspective view of the circuit body according to the embodiment, FIG. 14 is a perspective view of the case according to the embodiment, FIG. 15 is a cross-sectional view of the case according to the embodiment, FIG. 16 is a side view of the case and the circuit body according to the embodiment, FIG. 17 is a cross-sectional view of the case and the circuit body according to the embodiment, FIG. 18 is a cross-sectional view of the busbar module according to the embodiment, FIGS. 19 and 20 are cross-sectional views of the circuit body and the busbar according to the embodiment, and FIG. 21 is a perspective view of the busbar according to the embodiment. FIG. 12 illustrates a cross section taken along line XII-XII in FIG. 3. FIG. 15 illustrates a cross section taken along line XV-XV in FIG. 6. FIG. 17 illustrates a cross section taken along line XVII-XVII in FIG. 1. FIG. 18 illustrates a cross section taken along line XVIII-XVIII in FIG. 1. FIG. 19 illustrates a cross section taken along line XIX-XIX in FIG. 3. FIG. 20 illustrates a cross section taken along line XX-XX in FIG. 19.

As illustrated in FIG. 1, a battery pack 100 of the present embodiment includes a busbar module 1 and a battery module 110. The battery pack 100 is mounted as a power source on a vehicle such as an electric vehicle (EV), a hybrid electric vehicle (HEV), or a plug-in hybrid electric vehicle (PHEV). The battery pack 100 may include a plurality of busbar modules 1 and a plurality of battery modules 110.

The battery module 110 includes a plurality of battery cells 120. The illustrated shape of the battery cell 120 is a rectangular parallelepiped shape. Two electrodes 121 are disposed on a first surface 120a of the battery cell 120. The first surface 120a has a substantially rectangular shape.

The plurality of battery cells 120 are arranged in a first direction X. More specifically, the plurality of battery cells 120 are arranged in such a manner that a longer side of the first surface 120a faces a longer side of another adjacent first surface 120a in the first direction X. In the following description, a direction orthogonal to the first direction X on the first surface 120a is referred to as a "second direction Y". The second direction Y is a longitudinal direction of the first surface 120a. A direction orthogonal to both the first direction X and the second direction Y is referred to as a "third direction Z". The third direction Z is a height direction of the battery cell 120. The first surface 120a is orthogonal to the third direction Z. For example, the battery pack 100 is mounted on the vehicle in such a manner that the first surface 120a faces upward in a top-bottom direction of the vehicle.

The two electrodes 121 on the first surface 120a are arranged in the second direction Y. One of the two electrodes 121 on the first surface 120a is a positive electrode, and the other is a negative electrode. An aggregate of the electrodes 121 arranged at one ends of the first surfaces 120a in the longitudinal direction is referred to as a "first electrode group 121a". An aggregate of the electrodes 121 arranged at the other ends of the first surfaces 120a in the longitudinal direction is referred to as a "second electrode group 121b". In the battery module 110 of the present embodiment, the positive electrodes and the negative electrodes are alternately arranged in the first electrode group 121a. In the second electrode group 121b, the positive electrodes and the negative electrodes are alternately arranged. The busbar module 1 of the present embodiment connects the plurality of battery cells 120 in series.

The busbar module 1 includes a plurality of busbars 2, a plate-like circuit body 3, a case 4, and a cover 5. The busbar 2 is formed of a conductive metal plate such as copper or aluminum. As illustrated in FIGS. 2 and 3, the busbar module 1 includes a first busbar group 2A and a second busbar group 2B. The first busbar group 2A and the second busbar group 2B include the plurality of busbars 2 arranged in the first direction X. The busbars 2 of the first busbar group 2A are fixed to the first electrode group 121a of the battery module 110. The busbars 2 of the second busbar group 2B are fixed to the second electrode group 121b.

As illustrated in FIG. 4, the busbar 2 includes a main body 20 and a terminal 21. The main body 20 and the terminal 21 are electrically connected by welding or the like, for example. The main body 20 electrically connects two electrodes 121 adjacent to each other in the first direction X. The main body 20 includes a base portion 20a, a first connecting portion 20b, and a second connecting portion 20c. The base portion 20a has a rectangular flat plate shape and is orthogonal to the third direction Z.

The first connecting portion 20b and the second connecting portion 20c are arranged with a gap in the first direction X and protrude from the base portion 20a in the second direction Y. The first connecting portion 20b and the second connecting portion 20c are orthogonal to the third direction Z. The first connecting portion 20b is connected to one electrode 121 of two adjacent electrodes 121. The second connecting portion 20c is connected to the other electrode 121 of the two adjacent electrodes 121. Each of the first connecting portion 20b and the second connecting portion 20c may be connected to the electrode 121 by welding, may be connected to the electrode 121 by a fastening member, or may be connected to the electrode 121 by other means.

The terminal 21 has a flat plate shape and is fixed to the base portion 20a of the main body 20. The terminal 21 protrudes with respect to the base portion 20a toward a side opposite from a side of the first connecting portion 20b and the second connecting portion 20c. The terminal 21 has a first surface 21a and a second surface 21b. The first surface 21a is one of two main surfaces of the terminal 21, and faces the base portion 20a in the third direction Z. The second surface 21b is the other of the two main surfaces of the terminal 21.

A through-hole 21c penetrating through the terminal 21 in a thickness direction is formed in the terminal 21. The through-hole 21c is disposed at a distal end portion of the terminal 21. The through-hole 21c is opened in each of the first surface 21a and the second surface 21b.

The circuit body 3 is a plate-like circuit body and has flexibility. The circuit body 3 of the present embodiment is a flexible printed circuit (FPC). The circuit body 3 includes a plurality of connection conductors 6 corresponding to the plurality of busbars 2. As illustrated in FIGS. 2 and 3, the circuit body 3 includes a trunk portion 30 and a plurality of branch portions 31. The trunk portion 30 and the branch portion 31 are integrally formed.

The trunk portion 30 has a flat plate shape and extends along the first direction X. As illustrated in FIG. 3, the trunk portion 30 has a first side 30a and a second side 30b extending along the first direction X. The first side 30a is an edge of one end of the trunk portion 30 in the second direction Y. The second side 30b is an edge of the other end of the trunk portion 30 in the second direction Y. The branch portion 31 branches from the trunk portion 30. The illustrated circuit body 3 includes the plurality of branch portions 31 branching from the first side 30a and the plurality of branch portions 31 branching from the second side 30b. The branch portion 31 connected to the first side 30a is connected to the busbar 2 of the first busbar group 2A. The branch portion 31 connected to the second side 30b is connected to the busbar 2 of the second busbar group 2B.

The trunk portion 30 has a first end portion 30c and a second end portion 30d. The first end portion 30c is one end portion of the trunk portion 30 in the first direction X. The second end portion 30d is the other end portion of the trunk portion 30 in the first direction X. A connector 3c is connected to the first end portion 30c. The trunk portion 30 is connected to a monitoring device that monitors a state of the battery module 110 via the connector 3c. The monitoring device monitors, for example, a voltage and temperature of the battery cell 120.

A first through-hole 30e is provided in the first end portion 30c. A second through-hole 30f and a third through-hole 30g are provided in the second end portion 30d. The first through-hole 30e, the second through-hole 30f, and the third through-hole 30g penetrate through the trunk portion 30 in the third direction Z. The first through-hole 30e, the second through-hole 30f, and the third through-hole 30g are disposed, for example, at the center of the trunk portion 30 in the second direction Y. The illustrated shape of the first through-hole 30e is a circular shape having a uniform diameter. The illustrated shapes of the second through-hole 30f and the third through-hole 30g are oval shapes along the first direction X. In the first direction X, a length of the third through-hole 30g is larger than a length of the second through-hole 30f.

As illustrated in FIG. 5, the branch portion 31 includes a base portion 32, an intermediate portion 33, and a fixed portion 34. The base portion 32 protrudes from the trunk portion 30 toward the second direction Y. The fixed portion 34 is a portion fixed to the busbar 2 and is positioned at a distal end portion of the branch portion 31. The intermediate portion 33 extends along the first direction X from the base portion 32 toward the fixed portion 34.

The circuit body 3 includes a plurality of connection conductors 6. The connection conductor 6 of the present embodiment is a conductive metal foil, for example, a copper foil. The connection conductor 6 has a first portion 61 routed in the trunk portion 30 and a second portion 62 routed in the branch portion 31. An end portion of the first portion 61 is connected to the connector 3c. A proximal end of the second portion 62 is connected to the first portion 61. A distal end of the second portion 62 is connected to a chip fuse 3f.

The chip fuse 3f is disposed in the fixed portion 34. The chip fuse 3f is interposed between the second portion 62 and a pad 35. The chip fuse 3f is configured to cut between the pad 35 and the connection conductor 6 when an excessive current flows between the pad 35 and the connection conductor 6. The pad 35 is a metal foil formed on the fixed portion 34, and is exposed to an external space. The busbar 2 is soldered to the pad 35. The pad 35 includes a first pad 35a and a second pad 35b. The first pad 35a and the second pad 35b face each other in the second direction Y with the chip fuse 3f interposed therebetween. The first pad 35a and the second pad 35b are electrically connected to each other.

The circuit body 3 of the present embodiment is connected to the busbar 2 in a state where the intermediate portion 33 of the branch portion 31 is curved. Tolerances in position, height, and the like of the battery cell 120 are absorbed by the branch portion 31 of the circuit body 3. As described later, the branch portion 31 of the present embodiment has a thin portion 3b having a small thickness. The branch portion 31 connects the trunk portion 30 and the busbar 2 in a state where the thin portion 3b is curved. The branch portion 31 having the thin portion 3b has flexibility and high followability. Therefore, the busbar module 1 of the present embodiment can improve workability of attachment work with respect to the battery module 110. In addition, the busbar module 1 of the present embodiment can reduce a reaction force generated in the curved portion to suppress floating or the like of the circuit body 3.

As illustrated in FIG. 6, the case 4 includes a plurality of busbar accommodating portions 40, a plurality of bridge portions 41, and a plurality of coupling portions 42. The case 4 is molded using, for example, an insulating synthetic resin. The busbar accommodating portion 40, the bridge portion 41, and the coupling portion 42 are integrally formed. The case 4 has a rectangular shape elongated in the first direction X.

The busbar accommodating portion 40 is a portion that accommodates the busbar 2 and has a tubular shape in the third direction Z. One busbar accommodating portion 40 accommodates one busbar 2. The plurality of busbar accommodating portions 40 are arranged in the first direction X. The case 4 has a first side 4a and a second side 4b extending along the first direction X. The first side 4a is an edge of one end of the case 4 in the second direction Y. The second side 4b is an edge of the other end of the case 4 in the second direction Y.

The case 4 includes the plurality of busbar accommodating portions 40 arranged on the first side 4a and the plurality of busbar accommodating portions 40 arranged on the second side 4b. The busbar accommodating portion 40 on the first side 4a accommodates the busbar 2 of the first busbar group 2A. The busbar accommodating portion 40 on the second side 4b accommodates the busbar 2 of the second busbar group 2B. The busbar accommodating portion 40 has a partition wall 44. The partition wall 44 partitions between the first connecting portion 20b and the second connecting portion 20c of the busbar 2. The busbar accommodating portion 40 has a facing surface 45 connected to the partition wall 44. The facing surface 45 faces the base portion 20a and the terminal 21 of the busbar 2 in the third direction Z.

The bridge portion 41 connects one busbar accommodating portion 40 arranged on the first side 4a and one busbar accommodating portion 40 arranged on the second side 4b. The plurality of bridge portions 41 are arranged in the first direction X. The bridge portion 41 functions as a support that supports the trunk portion 30 of the circuit body 3. The bridge portion 41 extends in the second direction Y from the partition wall 44 on the first side 4a to the partition wall 44 on the second side 4b. The case 4 includes a first bridge portion 41A and a second bridge portion 41B. The first bridge portion 41A and the second bridge portion 41B are bridge portions 41 positioned at end portions in the first direction X among the plurality of bridge portions 41. The first bridge portion 41A supports the first end portion 30c of the circuit body 3. The second bridge portion 41B supports the second end portion 30d of the circuit body 3.

The coupling portion 42 is a portion that connects two adjacent busbar accommodating portions 40. As illustrated in FIG. 7, the coupling portion 42 has an arch shape. The coupling portion 42 has flexibility and allows relative movement of two adjacent busbar accommodating portions 40. More specifically, the coupling portion 42 is formed to allow the relative movement of the busbar accommodating portions 40 in at least the first direction X. The coupling portion 42 may allow the relative movement of the busbar accommodating portions 40 in the second direction Y and the third direction Z.

The case 4 includes a plurality of engaging pieces 43. The engaging piece 43 is disposed more inwards than the partition wall 44 in the second direction Y. The illustrated engaging piece 43 is provided at an end portion of the bridge portion 41. The engaging piece 43 protrudes in an arm shape in the third direction Z. A claw portion 43a is formed at a distal end portion of the engaging piece 43. The claw portion 43a protrudes in the second direction Y.

As illustrated in FIG. 6, the case 4 includes a first protrusion 46 and a third protrusion 47. The first protrusion 46 is a protrusion corresponding to the first through-hole 30e of the circuit body 3. The first protrusion 46 protrudes from the first bridge portion 41A in the third direction Z. The third protrusion 47 is a protrusion corresponding to the third through-hole 30g of the circuit body 3. The third protrusion 47 protrudes from the second bridge portion 41B in the third direction Z.

The cover 5 is a member that covers the circuit body 3 to protect the circuit body 3. The cover 5 is engaged with the case 4 and forms a space for accommodating the trunk portion 30 between the case 4 and the cover 5. The cover 5 is formed of, for example, an insulating synthetic resin. As illustrated in FIG. 8, the cover 5 includes a cover main body 50, an engaging portion 51, and a second protrusion 53. The cover main body 50, the engaging portion 51, and the second protrusion 53 are integrally formed.

The cover main body 50 has a substantially rectangular flat plate shape. The cover main body 50 has a first side 50a and a second side 50b extending along the first direction X. The first side 50a is an edge of one end of the cover main body 50 in the second direction Y. The second side 50b is an edge of the other end of the cover main body 50 in the second direction Y. As illustrated in FIG. 2, a plurality of reinforcing ribs 54 are provided on an outer surface 50d of the cover main body 50. The ribs 54 extend in the first direction X and the second direction Y.

As illustrated in FIGS. 2 and 8, the cover 5 includes a plurality of engaging portions 51. The engaging portion 51 engages with the engaging piece 43 of the case 4 to couple the cover 5 to the case 4. The engaging portions 51 are disposed on the first side 50a and the second side 50b. As illustrated in FIG. 8, the engaging portion 51 has a rectangular tube shape having an engaging hole 52. The engaging piece 43 of the case 4 is inserted into the engaging hole 52 in such a manner that the claw portion 43a protrudes from the engaging hole 52. The claw portion 43a of the engaging piece 43 is locked to the engaging portion 51 to couple the case 4 and the cover 5 with each other.

A length of the engaging hole 52 in the first direction X is sufficiently larger than a width of the engaging piece 43. Therefore, the engaging portion 51 allows the engaging piece 43 to relatively move in the first direction X with respect to the engaging portion 51. That is, the cover 5 allows the case 4 to expand and contract in the first direction X in a coupled state in which the cover 5 and the case 4 are coupled. The expansion and contraction of the case 4 is mainly caused by elastic deformation of the coupling portion 42. That is, the cover 5 allows two adjacent busbar accommodating portions 40 to relatively move in the first direction X in the coupled state.

The second protrusion 53 protrudes from an inner surface 50c of the cover main body 50. The second protrusion 53 is a protrusion corresponding to the second through-hole 30f of the circuit body 3. The illustrated shape of the second protrusion 53 is a columnar shape.

Details of the circuit body 3 will be described. FIG. 9 is a diagram for describing an internal configuration of the circuit body 3. FIG. 9 illustrates the branch portion 31 before being attached to the busbar 2 and the battery module 110. In FIG. 9, the connection conductor 6 is drawn by a solid line, but in the actual circuit body 3, the connection conductor 6 is covered with coating layers 11 and 12 to be described later and is thus not exposed.

The circuit body 3 of the present embodiment has a thick portion 3a illustrated in FIG. 10 and the thin portion 3b illustrated in FIG. 11. The thick portion 3a has a five-layer structure. On the other hand, the thin portion 3b has a three-layer structure. In the circuit body 3, at least the trunk portion 30 is composed of the thick portion 3a. Since conductor layers 13 and 14 are disposed on both surfaces of a base layer 10, respectively, both downsizing of the trunk portion 30 and routing of a large number of voltage detection circuits due to the multilayer structure are achieved. The thin portion 3b is provided at the intermediate portion 33 of the branch portion 31. The branch portion 31 connects the trunk portion 30 and the busbar 2 in a state where the thin portion 3b is flexurally deformed. Since the thin portion 3b having high flexibility is provided at the intermediate portion 33, workability of work of attaching the busbar 2 to the battery module 110 is improved.

As illustrated in FIG. 10, the thick portion 3a has a five-layer structure including a first circuit layer 7A and a second circuit layer 7B. The thick portion 3a includes the base layer 10, the first coating layer 11, the second coating layer 12, the first conductor layer 13, and the second conductor layer 14. The base layer 10, the first coating layer 11, and the second coating layer 12 are all formed of an insulating synthetic resin. The base layer 10, the first coating layer 11, and the second coating layer 12 are formed of, for example, a polyimide resin. Both the base layer 10 and the coating layers 11 and 12 are formed to have flexibility.

The first coating layer 11 is a layer that covers a first surface 10a of the base layer 10. The second coating layer 12 is a layer that covers a second surface 10b of the base layer 10. The first conductor layer 13 is a conductor layer disposed between the first surface 10a and the first coating layer 11, and has flexibility. The illustrated first conductor layer 13 is a metal foil formed on the first surface 10a. The first conductor layer 13 is typically the connection conductor 6. A part of the first conductor layer 13 may be a reinforcing layer 36 as described later. The connection conductor 6 and the reinforcing layer 36 are formed by etching the metal foil formed on the first surface 10a. After a circuit pattern or the like of the connection conductor 6 is formed on the first surface 10a, the first coating layer 11 is bonded to the first surface 10a and the first conductor layer 13.

The illustrated second conductor layer 14 is a metal foil formed on the second surface 10b and has flexibility. The second conductor layer 14 is typically the connection conductor 6. A part of the second conductor layer 14 may be the reinforcing layer 36. The connection conductor 6 and the reinforcing layer 36 are formed by etching the metal foil formed on the second surface 10b. After a circuit pattern or the like of the connection conductor 6 is formed on the second surface 10b, the second coating layer 12 is bonded to the second surface 10b and the second conductor layer 14.

FIG. 11 illustrates the thin portion 3b composed of the first circuit layer 7A. The illustrated thin portion 3b has a three-layer structure including the base layer 10, the first coating layer 11, and the first conductor layer 13. In this case, no metal foil is formed on the second surface 10b of the base layer 10, or the metal foil on the second surface 10b is removed by etching. Since the thin portion 3b is thinner than the thick portion 3a, the thin portion 3b has lower rigidity than that of the thick portion 3a and has flexibility. The thin portion 3b may be composed of the second circuit layer 7B.

As illustrated in FIG. 9, the thin portion 3b is provided at the intermediate portion 33 of the branch portion 31. More specifically, substantially the entire intermediate portion 33 is the thin portion 3b. Therefore, the illustrated branch portion 31 can connect the trunk portion 30 and the busbar 2 in a state where the entire intermediate portion 33 is flexurally deformed. A shape of the thin portion 3b in plan view is substantially rectangular. More specifically, the illustrated thin portion 3b has a shape in which a rectangular end portion is curved outward. In the branch portion 31, a portion excluding the thin portion 3b is composed of the thick portion 3a. That is, in the circuit body 3, the trunk portion 30, the base portion 32, and the fixed portion 34 are composed of the thick portion 3a.

As illustrated in FIG. 9, the circuit body 3 of the present embodiment includes the reinforcing layer 36. The reinforcing layer 36 is a metal foil that improves rigidity of a portion adjacent to the thin portion 3b. The reinforcing layer 36 and the connection conductor 6 are separated from each other by etching the same copper foil, for example. Note that the reinforcing layer 36 may be a metal foil thicker than the connection conductor 6. For example, the reinforcing layer 36 is disposed on a back side of the corresponding connection conductor 6. For example, in a case where the connection conductor 6 of the branch portion 31 illustrated in FIG. 9 is disposed on the first surface 10a of the base layer 10, the reinforcing layer 36 is disposed on the second surface 10b. A width of the reinforcing layer 36 is larger than a width of the connection conductor 6.

The reinforcing layer 36 includes a first reinforcing layer 36a and a second reinforcing layer 36b. The first reinforcing layer 36a is disposed at the trunk portion 30 and the base portion 32. The second reinforcing layer 36b is disposed at the fixed portion 34. The first reinforcing layer 36a has a first portion 36c disposed at the trunk portion 30 and a second portion 36d disposed at the base portion 32. The first portion 36c and the second portion 36d are integrated with each other.

The first portion 36c extends from a connecting portion 37 that connects the trunk portion 30 and the branch portion 31 toward both sides in the first direction X. A shape of the first portion 36c in plan view is substantially rectangular. A width of the first portion 36c is the largest at the connecting portion 37.

The second portion 36d is provided in substantially the entire region of the base portion 32. That is, the second portion 36d extends from the connecting portion 37 to a distal end of the base portion 32 in the second direction Y. A width of the second portion 36d is slightly smaller than a width of the base portion 32.

The first reinforcing layer 36a improves rigidity of the connecting portion 37 and suppresses bending and twisting of the connecting portion 37. In addition, the first reinforcing layer 36a improves rigidity of the base portion 32 and suppresses bending and twisting of the base portion 32. Therefore, the first reinforcing layer 36a enables flexural deformation of the intermediate portion 33 into a desired shape while suppressing deformation of the base portion 32 and the connecting portion 37.

The second reinforcing layer 36b is provided in substantially the entire region of the fixed portion 34. The illustrated second reinforcing layer 36b faces each of the second portion 62 of the connection conductor 6, the first pad 35a, and the second pad 35b. The second reinforcing layer 36b improves rigidity of the fixed portion 34 and suppresses bending and twisting of the fixed portion 34. Therefore, the second reinforcing layer 36b can improve reliability of electrical performance in the fixed portion 34.

As illustrated in FIG. 12, a thickness t2 of the thin portion 3b is smaller than a thickness t1 of the thick portion 3a. The thin portion 3b is provided from one end to the other end of the intermediate portion 33. Therefore, the branch portion 31 can connect the trunk portion 30 and the busbar 2 while flexurally deforming the intermediate portion 33 into a desired curved shape. The illustrated curved shape of the intermediate portion 33 is an S-shape. The intermediate portion 33 is bent so as to have a first curved portion 33a and a second curved portion 33b. The first curved portion 33a is curved toward one side in the first direction X. The second curved portion 33b is curved toward the other side in the first direction X. The intermediate portion 33 curved in the S-shape can appropriately absorb tolerances in the first direction X, the second direction Y, and the third direction Z.

In addition, since the thickness t2 of the intermediate portion 33 is small, a reaction force generated in the intermediate portion 33 is reduced. For example, the reaction force generated in the intermediate portion 33 is smaller than that in a case where the intermediate portion 33 is composed of the thick portion 3a. Therefore, the busbar module 1 of the present embodiment can improve workability of work of fixing the busbar 2 to the battery cell 120. In addition, the busbar module 1 can suppress floating and deformation of the circuit body 3 after the busbar 2 is fixed to the battery cell 120.

Note that the branch portion 31 of the circuit body 3 may be connected to an electronic component or element different from the chip fuse 3f. For example, as illustrated in FIG. 13, the circuit body 3 of the present embodiment includes a branch portion 31 connected to a thermistor 3s. The thermistor 3s is fixed to the battery cell 120 and detects a temperature of the battery cell 120. The detection result of the thermistor 3s is output to the monitoring device via the connection conductor 6.

The branch portion 31 illustrated in FIG. 13 has an extension portion 38 connected to the thermistor 3s. The extension portion 38 extends from the fixed portion 34 to the thermistor 3s in the first direction X. Two connection conductors 6 are routed in the branch portion 31. One of the two connection conductors 6 is a voltage detection line connected to the busbar 2 via the chip fuse 3*f*. The other of the two connection conductors 6 is a temperature detection line connected to the thermistor 3*s* from the fixed portion 34 via the extension portion 38. The extension portion 38 connects the fixed portion 34 and the thermistor 3*s* in a flexurally deformed state. The thin portion 3*b* may be provided at the extension portion 38. For example, the entire extension portion 38 may be the thin portion 3*b*.

As described below, the case 4 of the present embodiment can hold the circuit body 3 in a state where the intermediate portion 33 is flexurally deformed. As illustrated in FIGS. 14 and 15, the first protrusion 46 of the case 4 includes a shaft portion 46*a* and an eaves portion 46*b*. The shaft portion 46*a* is a proximal end portion of the first protrusion 46, and is connected to the first bridge portion 41A. A shape of the shaft portion 46*a* is a columnar shape along the third direction Z. The eaves portion 46*b* protrudes from a distal end of the shaft portion 46*a*. A shape of the eaves portion 46*b* is a columnar shape along the third direction Z. A value of an outer diameter of the eaves portion 46*b* is, for example, the same as a value of an outer diameter of the shaft portion 46*a*. The eaves portion 46*b* is positioned on an axis different from an axis of the shaft portion 46*a*, and is eccentric with respect to the shaft portion 46*a*. The illustrated eaves portion 46*b* is shifted with respect to the shaft portion 46*a* in the first direction X.

Attachment of the circuit body 3 to the case 4 will be described with reference to FIGS. 16 and 17. FIG. 16 illustrates a state in which the busbar 2 is accommodated in the busbar accommodating portion 40. The busbar 2 is fixed to the fixed portion 34 in advance. An operator places the trunk portion 30 of the circuit body 3 on the bridge portion 41 of the case 4 and makes the busbar 2 be accommodated in the corresponding busbar accommodating portion 40. The busbar accommodating portion 40 accommodates the busbar 2 and positions the busbar 2 and the fixed portion 34. The shape of the intermediate portion 33 of the branch portion 31 at this time is a shape before being bent into an S-shape.

As indicated by an arrow Ar1 in FIG. 17, the operator inserts the first protrusion 46 into the first through-hole 30*e* of the circuit body 3 while pulling the trunk portion 30 in the first direction X. The circuit body 3 is configured in such a manner that the intermediate portion 33 is curved into a desired S-shape when the first through-hole 30*e* is positioned at the first protrusion 46. Therefore, the operator can flexurally deform each intermediate portion 33 into an S-shape by inserting the first protrusion 46 into the first through-hole 30*e*.

The operator hooks the first through-hole 30*e* on the shaft portion 46*a* of the first protrusion 46. The outer diameter of the shaft portion 46*a* is equal to an inner diameter of the first through-hole 30*e*. Therefore, the shaft portion 46*a* can position the trunk portion 30 at a predetermined position in the first direction X. The eaves portion 46*b* protrudes in a direction opposite to a direction of a reaction force F1 generated by the branch portion 31. Therefore, the eaves portion 46*b* restricts the trunk portion 30 from being detached from the first protrusion 46.

The first protrusion 46 locks the first end portion 30*c* of the trunk portion 30 while being inserted into the first through-hole 30*e*. The first protrusion 46 locks the first end portion 30*c* against the reaction force F1 and holds the first end portion 30*c* at a predetermined position. With such a configuration, the first protrusion 46 can hold the circuit body 3 in a state where the intermediate portion 33 of the circuit body 3 is flexurally deformed.

As illustrated in FIGS. 14 and 15, the case 4 includes an engaging piece 48 that positions the cover 5 in the first direction X. The engaging piece 48 protrudes from the first bridge portion 41A in the third direction Z. The engaging piece 48 is disposed in the vicinity of the first protrusion 46 in the first direction X. A shape of the engaging piece 48 is similar to a shape of the engaging piece 43. As illustrated in FIG. 15, a claw portion 48*a* of the engaging piece 48 protrudes in the first direction X. As illustrated in FIG. 2, the cover 5 includes an engaging portion 55 corresponding to the engaging piece 48. The engaging piece 48 is engaged with the engaging portion 55 to restrict relative movement of the cover 5 with respect to the first bridge portion 41A.

In the busbar module 1 of the present embodiment, the curved shape of the intermediate portion 33 can be maintained by the second protrusion 53 of the cover 5. As illustrated in FIG. 18, the second protrusion 53 is coupled to the case 4 while being inserted into the second through-hole 30*f* of the circuit body 3. The second protrusion 53 limits a movement range of the second end portion 30*d* in the first direction X. A movable range of the second end portion 30*d* is determined by a length L1 of the second through-hole 30*f*.

For example, in a case where the second end portion 30*d* moves relative to the cover 5 in a direction of an arrow X1, the second protrusion 53 locks the second end portion 30*d*. The direction of the arrow X1 is a direction in which the second end portion 30*d* approaches the first end portion 30*c* in the first direction X. When the second end portion 30*d* moves in the direction of the arrow X1, flexure may occur at the trunk portion 30. Therefore, the second protrusion 53 suppresses the movement range of the second end portion 30*d* to suppress the flexure of the trunk portion 30. The second protrusion 53 can maintain the desired curved shape of the intermediate portion 33 by limiting the movement of the second end portion 30*d*.

As described above, the cover 5 of the present embodiment includes the flat cover main body 50. The cover main body 50 is formed in a single plate shape and has high rigidity against a force in the first direction X. On the other hand, the case 4 can expand and contract in the first direction X so that the busbar 2 can follow the battery cell 120. As described below, the cover 5 of the present embodiment can restrict the flexure of the trunk portion 30 caused by the expansion and contraction of the case 4.

The cover 5 is engaged with the engaging piece 48 of the case 4 at the engaging portion 55 (see FIG. 2), and is positioned with respect to the first protrusion 46. In other words, the engaging portion 55 is positioned with respect to the first through-hole 30*e* of the circuit body 3 via the engaging piece 48 and the first protrusion 46. Further, the cover 5 locks the second through-hole 30*f* of the circuit body 3 by the second protrusion 53. In this manner, the cover 5 is positioned with respect to one end of the trunk portion 30 and locks the other end of the trunk portion 30, such that it is possible to appropriately suppress the flexure of the trunk portion 30.

As illustrated in FIG. 19, the branch portion 31 is fixed to the terminal 21 in a state where the fixed portion 34 faces the first surface 21*a* of the terminal 21. That is, the branch portion 31 is routed under the terminal 21. A surface of the fixed portion 34 on which the chip fuse 3*f* is mounted faces the first surface 21*a* of the terminal 21. The busbar 2 overlaps the fixed portion 34 so as to expose the chip fuse 3*f* to the through-hole 21*c*. As described above, the terminal 21 is fixed to the fixed portion 34 by being soldered to the pad 35 of the fixed portion 34.

The through-hole 21c of the terminal 21 is filled with a potting agent 8. The potting agent 8 filling the through-hole 21c covers the chip fuse 3f to protect the chip fuse 3f. For example, the potting agent 8 fills the through-hole 21c so as to cover each side surface and an upper surface of the chip fuse 3f. Filling with the potting agent 8 may be made to protect a connecting portion between the pad 35 and the terminal 21. The circuit body 3 and the busbar 2 are attached to the case 4 in a state where the intermediate portion 33 of the branch portion 31 is flexurally deformed into an S-shape. The busbar 2 is accommodated in the busbar accommodating portion 40.

As illustrated in FIG. 19, the branch portion 31 has a facing portion 39. The facing portion 39 is a portion of the branch portion 31 that faces the first surface 21a of the terminal 21. The busbar 2 of the present embodiment has a groove-shaped recess 22 formed in the first surface 21a. As described below, the busbar 2 having the recess 22 can suppress damage to the connection conductor 6.

As illustrated in FIGS. 19 and 20, the recess 22 is disposed at a position facing the connection conductor 6 of the branch portion 31. As illustrated in FIG. 21, the recess 22 extends in the first direction X from a side surface 21d of the terminal 21 to the through-hole 21c. A shape of the recess 22 when viewed in the first direction X is a rectangular shape or a trapezoidal shape. The terminal 21 illustrated in FIG. 21 has two recesses 22. The two recesses 22 are disposed on both sides of the through-hole 21c in the first direction X, respectively. Therefore, in the terminal 21, the recess 22 can face the connection conductor 6 even in a case where the connection conductor 6 is routed on any side in the first direction X with respect to the through-hole 21c.

As described above, the connection conductor 6 of the present embodiment is a metal foil such as a copper foil. In the branch portion 31 illustrated in FIG. 20, the connection conductor 6 of the first circuit layer 7A is connected to the busbar 2. The illustrated connection conductor 6 is formed on the first surface 10a of the base layer 10. The first coating layer 11 is attached to the base layer 10 on which the connection conductor 6 is formed. The branch portion 31 is fixed to the busbar 2 in such a manner that the first coating layer 11 faces the first surface 21a of the terminal 21 and the connection conductor 6 faces the recess 22.

Since the recess 22 faces the connection conductor 6, the connection conductor 6 is less likely to be damaged. For example, when the branch portion 31 vibrates or is bent, the connection conductor 6 is prevented from being damaged by the terminal 21.

The first coating layer 11 may have a raised portion 11a corresponding to the connection conductor 6. A width of the recess 22 is larger than the width of the connection conductor 6 and a width of the raised portion 11a. The width of the recess 22 is determined in such a manner that the recess 22 can face the connection conductor 6 even in a case where the connection conductor 6 is out of position due to tolerance, for example. A depth of the recess 22 is, for example, equal to or greater than a thickness of the connection conductor 6. The depth of the recess 22 may be equal to or greater than a height of the raised portion 11a in design.

In the busbar module 1 of the present embodiment, since the recess 22 is provided in the busbar 2, leakage of the potting agent 8 can be suppressed. A comparative example in which the terminal 21 does not have the recess 22 will be described. In the comparative example, the raised portion 11a comes into contact with the first surface 10a, and a gap is generated in a wide range between the fixed portion 34 and the first surface 10a. As a result, the potting agent 8 easily leaks out from the gap. On the other hand, in the busbar module 1 of the present embodiment, a portion of the first surface 10a excluding the recess 22 can be brought into contact with the fixed portion 34 or can be sufficiently close to the fixed portion 34. Therefore, leakage of the potting agent 8 filling the through-hole 21c is suppressed.

From the viewpoint of suppressing leakage of the potting agent 8, it is preferable that the depth of the recess 22 is not excessively large. On the other hand, from the viewpoint of suppressing damage to the connection conductor 6, the depth of the recess 22 is preferably not excessively small. The depth of the recess 22 is preferably determined within a range in which leakage of the potting agent 8 can be suppressed according to the viscosity of the potting agent 8, for example. As an example, the depth of the recess 22 may be set to a maximum value at which leakage of the potting agent 8 can be suppressed.

Note that, as illustrated in FIG. 13, the branch portion 31 of the circuit body 3 may include the branch portion 31 connected to the thermistor 3s. In this case, each of two connection conductors 6 preferably faces the recess 22 of the terminal 21. With such a configuration, the voltage detection line and the temperature detection line are less likely to be damaged by the terminal 21.

As described above, the busbar module 1 of the present embodiment includes the plurality of busbars 2, the plate-like circuit body 3 having flexibility, and the case 4. The busbar 2 is fixed to the battery cell 120 of the battery module 110. The circuit body 3 includes a plurality of connection conductors 6 corresponding to the plurality of busbars 2. The case 4 accommodates the circuit body 3 and the busbars 2.

The circuit body 3 includes the trunk portion 30 and the branch portion 31 branching from the trunk portion 30 and connected to the busbar 2. The branch portion 31 includes the base layer 10, the metal foil that is the connection conductor 6 and is formed on the base layer 10, and the coating layer that covers the base layer 10 and the metal foil. The branch portion 31 has the facing portion 39 at which the coating layer faces the first surface 21a of the busbar 2. In the branch portion 31, the metal foil is connected to the connection target at a portion that is more adjacent to the distal end than the facing portion 39 is. The first surface 21a of the busbar 2 has the groove-shaped recess 22 provided at a portion facing the metal foil. The busbar module 1 of the present embodiment can suppress damage to the connection conductor 6.

The connection target illustrated in the present embodiment is the chip fuse 3f interposed between the metal foil and the busbar 2, or the thermistor 3s that detects the temperature of the battery cell 120. In this case, the busbar 2 having the recess 22 can suppress damage to the voltage detection line and the temperature detection line.

The connection target of the present embodiment is the chip fuse 3f mounted on the branch portion 31 and interposed between the metal foil and the busbar 2. The busbar 2 has the through-hole 21c opened in the first surface 21a, and overlaps the branch portion 31 so as to expose the chip fuse 3f in the through-hole 21c. The through-hole 21c is filled with the potting agent 8. The busbar 2 having the recess 22 can improve adhesion between a portion excluding the recess 22 and the branch portion 31 and suppress leakage of the potting agent 8.

Note that the circuit body 3 is not limited to the flexible printed circuit board, and may be a flat cable (so-called FC), a flexible flat cable (so-called FFC), or the like.

The shape of the flexurally deformed intermediate portion 33 in a state where the busbar 2 is fixed to the battery cell 120 is not limited to the illustrated S-shape. The intermediate portion 33 may be flexurally deformed so as to be able to absorb positional deviation caused by tolerance.

Modified Example of Embodiment

A modified example of the embodiment will be described. By reducing the thickness of the first coating layer 11 or the second coating layer 12, the rigidity of the thin portion 3*b* may be reduced. For example, in a case where the thin portion 3*b* is composed of the first circuit layer 7A, the thickness of the first coating layer 11 in the thin portion 3*b* may be smaller than the thickness of the first coating layer 11 in the thick portion 3*a*.

The circuit body 3 may include another circuit layer in addition to the first circuit layer 7A and the second circuit layer 7B. In other words, the circuit body 3 may have a multilayer structure including six or more layers. For example, the thick portion 3*a* may include a third circuit layer stacked on the first circuit layer 7A or the second circuit layer 7B. The third circuit layer includes, for example, a third conductor layer and a third coating layer. The thick portion 3*a* in this case has a seven-layer structure.

The disposition and shape of the first protrusion 46 in the case 4 are not limited to the illustrated disposition and shape. For example, the first protrusion 46 may be disposed on the second bridge portion 41B. In this case, the first through-hole 30*e* is disposed at the second end portion 30*d* of the circuit body 3, and the second through-hole 30*f* is disposed at the first end portion 30*c*. The second protrusion 53 of the cover 5 is disposed at a position corresponding to the second through-hole 30*f*.

The disposition and shape of the recess 22 are not limited to the illustrated disposition and shape. For example, a cross-sectional shape of the recess 22 may be an arc shape or a triangular shape.

A connection target to which the metal foil of the branch portion 31 is connected is not limited to an electronic component or element. For example, the metal foil of the branch portion 31 may be connected to the terminal 21 of the busbar 2 without interposing an electronic component or element therebetween.

The contents disclosed in the above embodiment and modified example can be appropriately combined and executed.

In the busbar module according to the embodiment, the branch portion of the circuit body includes the metal foil as the connection conductor and the coating layer covering the metal foil. The branch portion has a facing portion at which the coating layer faces the first surface of the busbar. The first surface of the busbar has a groove-shaped recess provided at a portion facing the metal foil. The busbar having the recess can suppress damage to the metal foil when the branch portion vibrates or is bent. Therefore, the busbar module according to the embodiment has an effect of protecting the connection conductor.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A busbar module comprising:
a plurality of busbars configured to be fixed to a plurality of battery cells of a battery module including the plurality of battery cells;
a plate-like flexible circuit body that includes a plurality of connection conductors corresponding to the plurality of busbars; and
a case that accommodates the circuit body and the plurality of busbars, wherein
the circuit body includes a trunk portion and a plurality of branch portions, each of the plurality of branch portions branching from the trunk portion and being connected to each of the plurality of busbars, respectively,
each of the plurality of branch portions includes a base layer, a metal foil that is a connection conductor from among the plurality of connection conductors and is formed on the base layer, and a coating layer that covers the base layer and the metal foil,
the branch portion has a facing portion at which the coating layer faces a first surface of the busbar,
the metal foil is connected to a connection target at a portion that is more adjacent to a distal end of the branch portion than the facing portion is, and
the first surface of the busbar has a groove-shaped recess provided at a portion facing the metal foil.

2. The busbar module according to claim 1, wherein the connection target is a chip fuse interposed between the metal foil and the busbar, or a thermistor that detects a temperature of the battery cell.

3. The busbar module according to claim 1, wherein the connection target is a chip fuse mounted on the branch portion and interposed between the metal foil and the busbar,
the busbar has a through-hole opened in the first surface and overlaps the branch portion so as to expose the chip fuse in the through-hole, and
the through-hole is filled with a potting agent.

* * * * *